(12) United States Patent
Tazawa et al.

(10) Patent No.: US 12,451,395 B2
(45) Date of Patent: Oct. 21, 2025

(54) METHOD FOR EVALUATING PICKUP PERFORMANCE, INTEGRATED DICING/DIE-BONDING FILM, METHOD FOR EVALUATING AND SELECTING INTEGRATED DICING/DIE-BONDING FILM, AND METHOD FOR MANUFACTURING SEMICONDUCTOR DEVICE

(71) Applicant: Resonac Corporation, Tokyo (JP)

(72) Inventors: Tsuyoshi Tazawa, Tokyo (JP); Naohiro Kimura, Tokyo (JP); Keisuke Ohkubo, Tokyo (JP); Yoshinobu Ozaki, Tokyo (JP)

( * ) Notice: Subject to any disclaimer, the term of this patent is extended or adjusted under 35 U.S.C. 154(b) by 698 days.

(21) Appl. No.: 17/609,403

(22) PCT Filed: May 10, 2019

(86) PCT No.: PCT/JP2019/018812
§ 371 (c)(1),
(2) Date: Nov. 8, 2021

(87) PCT Pub. No.: WO2020/230209
PCT Pub. Date: Nov. 19, 2020

(65) Prior Publication Data
US 2022/0216114 A1 Jul. 7, 2022

(51) Int. Cl.
*H01L 21/66* (2006.01)
*H01L 21/683* (2006.01)
*H01L 21/78* (2006.01)

(52) U.S. Cl.
CPC .......... *H01L 22/10* (2013.01); *H01L 21/6836* (2013.01); *H01L 21/78* (2013.01);
(Continued)

(58) Field of Classification Search
CPC .... C09J 2203/00; C09J 2203/326; C09J 5/00; H01L 21/683; H01L 21/6836;
(Continued)

(56) References Cited

U.S. PATENT DOCUMENTS

2008/0242052 A1 10/2008 Feng et al.
2010/0279491 A1 11/2010 Kiuchi et al.
(Continued)

FOREIGN PATENT DOCUMENTS

CN 101794722 8/2010
CN 103109353 5/2013
(Continued)

OTHER PUBLICATIONS

International Preliminary Report on Patentability with Written Opinion dated Nov. 25, 2021 for PCT/JP2019/018812.
(Continued)

*Primary Examiner* — Julio J Maldonado
*Assistant Examiner* — Stanetta D Isaac
(74) *Attorney, Agent, or Firm* — SOEI PATENT & LAW FIRM

(57) ABSTRACT

A method for evaluating pickup property of a dicing/die-bonding integrated film including a base layer, an adhesive, and a bonding adhesive layer in order, the method including preparing a laminate including the dicing/die-bonding integrated film and a wafer having a thickness of 10 to 100 μm laminated on the bonding adhesive layer, singulating the wafer into a plurality of chips having an area of 9 mm² or less, pushing a center portion of the chip from a side of the base layer, and measuring a peeling strength when an edge of the chip is peeled off from the adhesive layer.

19 Claims, 11 Drawing Sheets

(52) U.S. Cl.
CPC ............... *H01L 2221/68327* (2013.01); *H01L 2221/68386* (2013.01)

(58) Field of Classification Search
CPC ..... H01L 21/6835–68792; H01L 22/10; H01L 22/12; H01L 2924/00014; H01L 2924/10253; H01L 25/0657; H01L 2225/0651; H01L 2225/06562; H01L 2221/68327; H01L 2221/68386; H01L 2221/68336; H01L 2221/68354; H01L 2221/6839; H01L 24/32; H01L 24/27; H01L 24/29; H01L 24/83; H01L 24/48; H01L 24/73; H01L 24/92; G01N 19/00; G01N 19/04
See application file for complete search history.

(56) References Cited

U.S. PATENT DOCUMENTS

| | | | |
|---|---|---|---|
| 2011/0189835 A1* | 8/2011 | Sugo ..................... | B32B 7/12 438/464 |
| 2012/0028380 A1* | 2/2012 | Takamoto ............. | B32B 27/306 156/60 |
| 2012/0108012 A1* | 5/2012 | Yasuda .................. | H01L 24/29 428/192 |
| 2015/0364357 A1 | 12/2015 | Takamoto et al. | |

FOREIGN PATENT DOCUMENTS

| | | |
|---|---|---|
| JP | 2007-285795 | 11/2007 |
| JP | 2009-130332 | 6/2009 |
| JP | 4443962 | 3/2010 |
| JP | 2012-019115 | 1/2012 |
| JP | 2012-069586 | 4/2012 |
| JP | 2012-153818 | 8/2012 |
| JP | 2012-153819 | 8/2012 |
| JP | 2014-045034 | 3/2014 |
| JP | 2014-135469 | 7/2014 |
| JP | 2016-015456 | 1/2016 |
| JP | 2018-107386 | 7/2018 |
| KR | 1020170131830 | 11/2017 |
| TW | 201905995 | 2/2019 |
| WO | 2016/140163 | 9/2016 |
| WO | 2018/164175 | 9/2018 |

OTHER PUBLICATIONS

International Search Report dated Jun. 4, 2019 for PCT/JP2019/018812.

* cited by examiner

METHOD FOR EVALUATING PICKUP PERFORMANCE, INTEGRATED DICING/DIE-BONDING FILM, METHOD FOR EVALUATING AND SELECTING INTEGRATED DICING/DIE-BONDING FILM, AND METHOD FOR MANUFACTURING SEMICONDUCTOR DEVICE

CROSS-REFERENCE TO RELATED APPLICATION

This application is a 35 U.S.C. § 371 national phase application of PCT/JP2019/018812, filed on May 10, 2019.

TECHNICAL FIELD

The present disclosure relates to a method for evaluating pickup property, a dicing/die-bonding integrated film, methods for evaluating and sorting a dicing/die-bonding integrated film, and a method for manufacturing a semiconductor device.

BACKGROUND ART

A semiconductor device is manufactured through the following processes. First, a dicing process is executed in a state where an adhesive film for dicing is pasted to a wafer. Thereafter, an expansion process, a pickup process, a mounting process, a die bonding process, and the like are executed.

In a manufacturing process of a semiconductor device, a film called a dicing/die-bonding integrated film has been used (see Patent Literatures 1 and 2). This film has a structure in which a base layer, an adhesive layer, and a bonding adhesive layer are stacked in order, and is used as follows, for example. First, a wafer is diced in a state where a surface of the bonding adhesive layer is pasted to the wafer and the wafer is fixed with a dicing ring. Thereby, the wafer is singulated into a plurality of chips. Subsequently, the adhesive force of the adhesive layer with respect to the bonding adhesive layer is weakened by irradiating the adhesive layer with ultraviolet rays, and then bonding adhesive pieces obtained by singulating the bonding adhesive layer and chips are picked up from the adhesive layer. Thereafter, a semiconductor device is manufactured through a process of mounting the chips on a substrate or the like through the bonding adhesive pieces. Hereinafter, depending on circumstances, a laminate of a chip and a bonding adhesive piece is referred to as a "bonding adhesive piece-attached chip".

As described above, an adhesive layer (dicing film) whose adhesive force is weakened by irradiation of ultraviolet rays is referred to as a UV curable type. On the other hand, an adhesive layer which is not irradiated with ultraviolet rays in the manufacturing process of a semiconductor device and whose adhesive force is constant without any changes is referred to as a pressure-sensitive type. A dicing/die-bonding integrated film provided with a pressure-sensitive adhesive layer has merits in that users (mainly, semiconductor device manufacturers) need not execute a process of irradiation of ultraviolet rays and there is no need of facilities therefor. Patent Literature 3 discloses a dicing/die-bonding film that can be called a UV curable type in terms that a pressure-sensitive adhesive layer contains a component to be cured by ultraviolet rays, whereas can also be called a pressure-sensitive type in terms that only a predetermined part of the pressure-sensitive adhesive layer is irradiated with ultraviolet rays in advance and users have no necessity of irradiation of ultraviolet rays in the manufacturing process of a semiconductor device.

CITATION LIST

Patent Literature

Patent Literature 1: Japanese Unexamined Patent Publication No. 2012-069586
Patent Literature 2: Japanese Unexamined Patent Publication No. 2014-135469
Patent Literature 3: Japanese Patent No. 4443962

SUMMARY OF INVENTION

Technical Problem

The adhesive layer of the dicing/die bond integrated film is required to have high adhesive force with respect to the bonding adhesive layer and the dicing ring in the dicing process. When the adhesive force of the adhesive layer is not sufficient, a phenomenon that peeling occurs between the bonding adhesive layer and the adhesive layer and thereby the bonding adhesive piece-attached chips fly (hereinafter, this is referred to as "DAF flying"; DAF is a die attach film) according to high-speed rotation of a dicing blade occurs, or a phenomenon that the dicing ring is peeled off from the adhesive layer by water flow of cutting water (hereinafter, this phenomenon is referred to as "ring peeling") occurs. On the other hand, in the pickup process, the adhesive force of the adhesive layer with respect to the bonding adhesive layer is required to be low to some extent, from the viewpoint of having excellent pickup property. When the adhesive force of the adhesive layer is excessively strong, the bonding adhesive piece-attached chip is not peeled off from the adhesive layer to cause a pickup failure or cause chip breakage, thereby lowering a yield.

Meanwhile, the present inventors have found out that, in a case where a wafer is singulated into small chips (for example, having an area in plan view of 9 mm$^2$ or less) by dicing, a unique pickup behavior in terms of conventional knowledge is shown in the subsequent pickup process. That is, if a chip having a relatively large size (for example, length 8 mm×width 6 mm) is a pickup target, even when the adhesive force of the adhesive layer is lowered to the extent that excellent pickup property can be achieved, a phenomenon that pickup property is not sufficient in a case where a pickup target is a small chip occurs. The present inventors have conducted intensive studies on a primary factor, and as a result, have found that, in the case of a small chip, peeling of an edge of the chip from the adhesive layer (hereinafter, referred to as "edge peeling") is a dominant factor of pickup property. Incidentally, it is speculated that, in the case of a chip having a relatively large size, peeling of an interface between the chip surface, rather than the edge of the chip, and the adhesive layer is a dominant factor of pickup property.

The present disclosure provides methods for evaluating and sorting a dicing/die-bonding integrated film in consideration of an influence of edge peeling of a small chip (having an area of 9 mm$^2$ or less). Furthermore, the present disclosure provides a method for evaluating pickup property in consideration of an influence of edge peeling of a small chip, a dicing/die-bonding integrated film having excellent pickup property of a small chip, and a method for manufacturing a semiconductor device by using the film.

Solution to Problem

An aspect of the present disclosure relates to a method for evaluating a dicing/die-bonding integrated film. This evaluating method is to evaluate the pickup property of a dicing/die-bonding integrated film which is applied to a semiconductor device manufacturing process including a process of singulating a wafer into a plurality of chips having an area of 9 mm$^2$ or less. This evaluating method includes the following processes (A) to (D), and when an edge peeling strength measured in the process (D) exceeds 1.2 N, it is determined that the pickup property of the dicing/die-bonding integrated film is poor.

(A) preparing a dicing/die-bonding integrated film serving as an evaluation target, the dicing/die-bonding integrated film including a base layer, an adhesive layer having a first surface facing the base layer and a second surface opposite to the first surface, and a bonding adhesive layer provided to cover a center portion of the second surface of the adhesive layer;

(B) pasting a silicon wafer having a thickness of 50 µm to the bonding adhesive layer and pasting a dicing ring to the second surface of the adhesive layer;

(C) singulating the silicon wafer and the bonding adhesive layer into a plurality of bonding adhesive piece-attached chips to obtain the bonding adhesive piece-attached chips that have a square shape having a side length of 2 mm;

(D) pushing a center portion of the bonding adhesive piece-attached chip from a side of the base layer at a temperature of 23° C. at a rate of 60 mm/min and then measuring an edge peeling strength when an edge of the bonding adhesive piece-attached chip is peeled off from the adhesive layer.

According to the studies of the present inventors, the edge peeling strength is measured under the above-described conditions (such as the thickness of the silicon wafer and the size of the bonding adhesive piece-attached chip), and thereby measurement results with sufficiently high reproducibility can be obtained. Therefore, without actually performing picking-up in a die bonding apparatus used in the manufacturing of a semiconductor device, a dicing/die-bonding integrated film with a failure in pickup property can be efficiently figured out. This evaluating method is useful in terms that a dicing/die-bonding integrated film suitable for a new manufacturing process can be efficiently selected, for example, when there is some sort of change in the manufacturing process of a semiconductor device.

The evaluating method of the present disclosure is not limited to the case of measuring an edge peeling strength as described above and using a dicing/die-bonding integrated film as an evaluation target on the basis of the result, but may be used in the case of using pickup property of a chip in a manufacturing process of a semiconductor device as an evaluation target. An evaluating method according to an aspect of the present disclosure includes the following processes:

(i) preparing a laminate including at least a base layer, an adhesive layer, and a wafer having a thickness of 10 to 100 µm in order;

(ii) singulating the wafer into a plurality of chips having an area of 9 mm$^2$ or less; and (iii) pushing a center portion of the chip from a side of the base layer and then measuring an edge peeling strength when an edge of the chip is peeled off from the adhesive layer.

In the case of preparing a laminate including a bonding adhesive layer between an adhesive layer and a wafer in the above-described process (i), in the above-described process (ii), the semiconductor wafer and the bonding adhesive layer are singulated into a plurality of bonding adhesive piece-attached chips having an area of 9 mm$^2$ or less, and in the above-described process (iii), a center portion of the bonding adhesive piece-attached chip is pushed from a side of the base layer, and then an edge peeling strength when an edge of the bonding adhesive piece-attached chip is peeled off from the adhesive layer may be measured. The laminate including a bonding adhesive layer between an adhesive layer and a wafer can be obtained, for example, by laminating a dicing/die-bonding integrated film on the wafer.

An aspect of the present disclosure relates to a dicing/die-bonding integrated film. This dicing/die-bonding integrated film includes a base layer, an adhesive layer having a first surface facing the base layer and a second surface opposite to the first surface, and a bonding adhesive layer provided to cover a center portion of the second surface of the adhesive layer, and an edge peeling strength as measured through the following processes is 1.2 N or less.

<Measurement of Edge Peeling Strength>

Pasting a silicon wafer having a thickness of 50 µm to the bonding adhesive layer and pasting a dicing ring to the second surface of the adhesive layer;

Singulating the silicon wafer and the bonding adhesive layer into a plurality of bonding adhesive piece-attached chips to obtain the bonding adhesive piece-attached chips that have a square shape having a side length of 2 mm;

Pushing a center portion of the bonding adhesive piece-attached chip from a side of the base layer at a temperature of 23° C. at a rate of 60 mm/min and then measuring an edge peeling strength when an edge of the bonding adhesive piece-attached chip is peeled off from the adhesive layer.

The above-described dicing/die-bonding integrated film can be suitably applied to a semiconductor device manufacturing process including a process of singulating the wafer into a plurality of chips having an area of 9 mm$^2$ or less since the edge peeling strength of the bonding adhesive piece-attached chip (size: 2 mm×2 mm) is 1.2 N or less that is sufficiently low. Furthermore, in a case where the bonding adhesive layer is singulated together with the wafer by blade dicing, there are tendencies that burrs are likely to occur at the edge of the bonding adhesive layer and the edge peeling strength of the bonding adhesive piece-attached chip is increased. In the above-described dicing/die-bonding integrated film, even in a case where a plurality of bonding adhesive piece-attached chips are obtained by blade dicing, the edge peeling strength of the bonding adhesive piece-attached chip is preferably 1.2 N or less. In order for the dicing/die-bonding integrated film to satisfy this condition, for example, the following technical means may be appropriately adopted.

The cutting property of the bonding adhesive layer at the time of blade dicing is set to be increased by setting the viscosity of the bonding adhesive layer to be relatively high (by increasing elasticity) or decreasing the thickness (for example, 60 µm or less).

The elasticity of the adhesive layer is set to be relatively high or adhesive force is adjusted by changing the amount of the component (for example, a cross-linking agent or a photopolymerization initiator) of the adhesive layer.

The fracture elongation of the base layer is set to be small.

The thickness of the adhesive layer is increased (for example, 30 μm or more) so that cutting does not reach the base layer at the time of blade dicing.

An aspect of the present disclosure relates to a method for manufacturing a semiconductor device. This manufacturing method includes preparing a dicing/die-bonding integrated film in which an edge peeling strength as measured as described above is 1.2 N or less, pasting a wafer to the bonding adhesive layer of the dicing/die-bonding integrated film and pasting a dicing ring to the second surface of the adhesive layer, singulating the wafer and the bonding adhesive layer into a plurality of bonding adhesive piece-attached chips having an area of 9 mm$^2$ or less, picking up the bonding adhesive piece-attached chip from the adhesive layer, and mounting the bonding adhesive piece-attached chip on a substrate or another chip. According to the method for manufacturing a semiconductor device, excellent pickup property of the bonding adhesive piece-attached chip is easily achieved, and a semiconductor device can be manufactured with a sufficiently high yield.

An aspect of the present disclosure relates to a method for sorting a dicing/die-bonding integrated film. This sorting method includes comparing edge peeling strengths of two or more dicing/die-bonding integrated films to determine relative merits of pickup property of the two or more dicing/die-bonding integrated films. According to this sorting method, a dicing/die-bonding integrated film with which a semiconductor device can be manufactured with a high yield can be efficiently sorted.

Advantageous Effects of Invention

According to the present disclosure, there are provided methods for evaluating and sorting a dicing/die-bonding integrated film in consideration of an influence of edge peeling of a small chip (having an area of 9 mm$^2$ or less). Furthermore, according to the present disclosure, there are provided a method for evaluating pickup property in consideration of an influence of edge peeling of a small chip, a dicing/die-bonding integrated film having excellent pickup property of a small chip, and a method for manufacturing a semiconductor device by using the film.

DESCRIPTION OF EMBODIMENTS

Hereinafter, embodiments of the present disclosure will be specifically described with reference to the drawings. However, the present invention is not limited to the following embodiments. Incidentally, in the present specification, "(meth)acrylic acid" means acrylic acid or methacrylic acid, and "(meth)acrylate" means acrylate or methacrylate corresponding thereto. The expression "A or B" means that either one of A and B may be contained or both of A and B may be contained.

In the present specification, the term "layer" encompasses a structure of a shape thereof formed all over a surface seen as a plan view and also a structure of a shape thereof partially formed. Furthermore, in the present specification, the term "process" includes not only an independent process, and even if one process cannot be clearly distinguished from other processes, such process is included in the "process" as long as effects intended to be exerted by this process are attained. Furthermore, a numerical range expressed by using "to" indicates a range including the numerical values before and after "to" as the minimum value and the maximum value, respectively.

In the present specification, in a case where a plurality of substances corresponding to each component in a composition exist, a content of each component in the composition means the total amount of the plurality of substances that exist in the composition, unless otherwise specified. Furthermore, unless otherwise specified, exemplified materials may be used alone or may be used in combination of two or more kinds thereof. Furthermore, in a numerical range described in the present specification as stages, an upper or lower limit value of a numerical range in one stage may be replaced with an upper or lower limit value of a numerical range in another level. Furthermore, in a numerical range described in the present specification, an upper or lower limit value of the numerical range may be replaced with a value shown in Examples.

<Dicing/Die-Bonding Integrated Film>

Figure 1A:
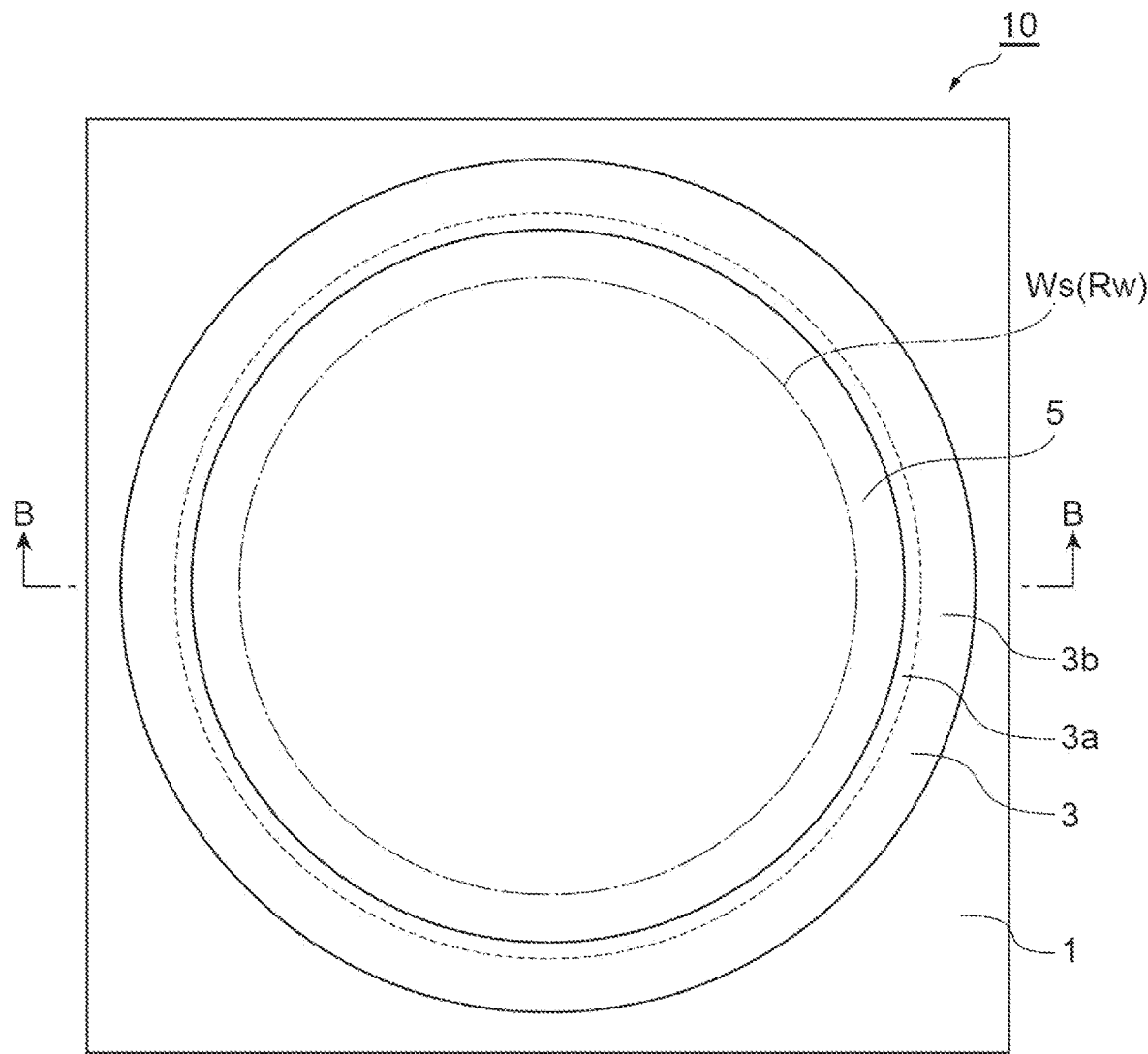
FIG. 1A is a plan view illustrating an embodiment of a dicing/die-bonding integrated film.
Figure 1B:
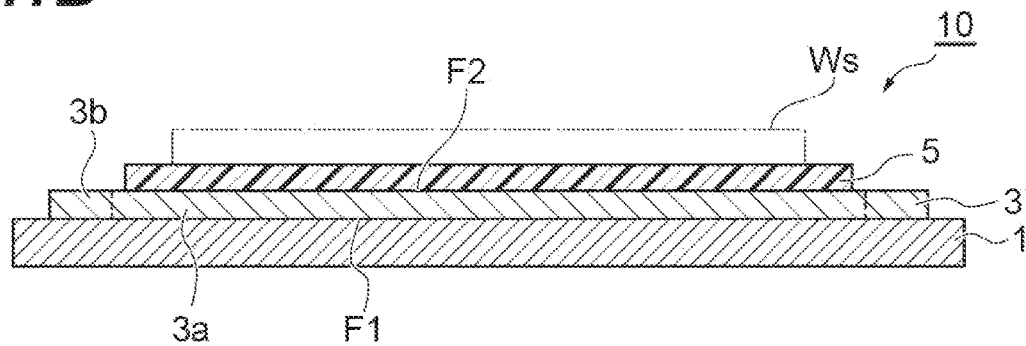
FIG. 1B is a schematic cross-sectional view taken along line B-B illustrated in FIG. 1A.

FIG. 1A is a plan view illustrating a dicing/die-bonding integrated film of the present embodiment, and FIG. 1B is a schematic cross-sectional view taken along line B-B of FIG. 1. A dicing/die-bonding integrated film 10 (hereinafter, simply referred to as the "film 10" depending on circumstances) is applied to a manufacturing process of a semiconductor device which includes a dicing process of singulating a wafer W into a plurality of chips having an area of 9 mm$^2$ or less and a pickup process performed thereafter (see FIG. 8C and FIG. 8D).

The film 10 includes a base layer 1, an adhesive layer 3 having a first surface F1 facing the base layer 1 and a second surface F2 opposite to the first surface F1, and a bonding adhesive layer 5 provided to cover a center portion of the second surface F2 of the adhesive layer 3 in order. In the present embodiment, the base layer 1 having a square shape is exemplified, but the base layer 1 may have a circular shape and may have the same size as that of the adhesive layer 3. Furthermore, in the present embodiment, an embodiment in which one laminate of the adhesive layer 3 and the bonding adhesive layer 5 is formed on the base layer 1 is exemplified, but an embodiment in which the base layer 1 has a predetermined length (for example, 100 in or more) and laminates of the adhesive layer 3 and the bonding adhesive layer 5 are disposed with a predetermined interval to be arranged in a longitudinal direction thereof may be employed.

The edge peeling strength of the film 10 is 1.2 N or less. The edge peeling strength is measured through the following processes.

<Measurement of Edge Peeling Strength>

Figure 2A:
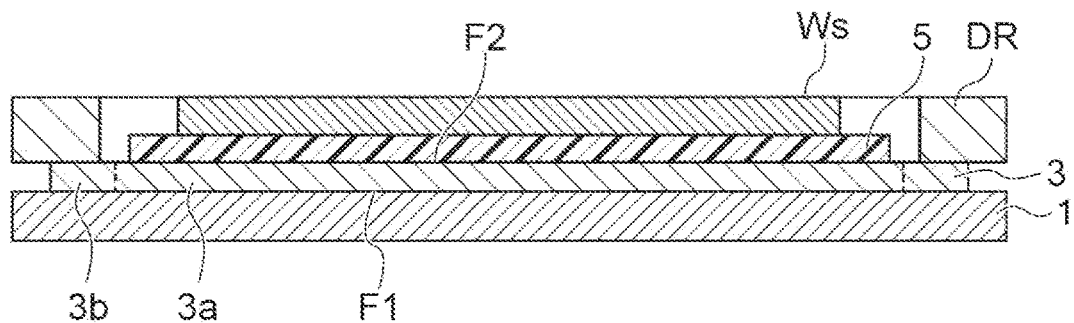
FIG. 2A to FIG. 2C are cross-sectional views schematically illustrating a process of measuring an edge peeling strength.

Pasting a silicon wafer Ws having a thickness of 50 μm to the bonding adhesive layer 5 and pasting a dicing ring DR to the second surface F2 of the adhesive layer 3 (see FIG. 2A);

Singulating the silicon wafer Ws and the bonding adhesive layer 5 into a plurality of bonding adhesive piece-attached chips Ta (hereinafter, simply referred to as the "chips Ta" depending on circumstances) (see FIG. 2B);

Pushing a center portion of the chip Ta from a side of the base layer 1 at a temperature of 23° C. at a rate of 60 mm/min (see FIG. 2C) and then measuring an edge peeling strength when an edge of the chip Ta is peeled off from the adhesive layer 3.

When the edge peeling strength of the film 10 is 1.2 N or less, the film 10 can be evaluated to be suitable for the dicing process of singulating a wafer into a plurality of chips having an area of 9 mm² or less and the subsequent pickup process. The upper limit value of the edge peeling strength of the film 10 may be 1.1 N or 0.9 N, and the lower limit value is, for example, 0.1 N and may be 0.15 N or 0.2 N.

Figure 2B:
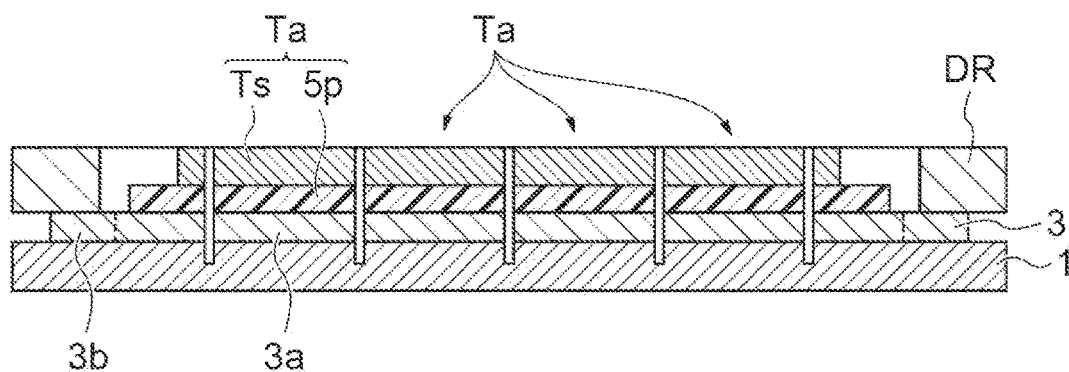

As illustrated in FIG. 2B, the chip Ta is configured by a chip Ts and a bonding adhesive piece 5*p*. The process of singulating the silicon wafer Ws and the bonding adhesive layer 5 into a plurality of chips Ta may be executed, for example, by blade dicing under the following conditions.

<Dicing Conditions>

Dicer: DFD6361 (manufactured by DISCO Corporation)
Blade: ZH05-5D4000-N1-70-BB (manufactured by DISCO Corporation)
Blade rotation number: 40000 rpm
Dicing rate: 30 mm/sec
Blade height: 90 μm
Cutting depth from the surface of the adhesive layer 3: 20 μm
Shape of chip Ta in plan view: Square shape of 2 mm×2 mm As the type of the blade, in order to secure the processing quality of chips and to suppress cutting scraps (burrs) generated from the bonding adhesive layer 5, the adhesive layer 3, and the base layer 1, blades #4000 to #4800 having a fine particle diameter in the case of blades manufactured by DISCO Corporation are preferably used.

The reasons why the silicon wafer Ws having a thickness of 50 μm is used are as follows. For example, in a case where the thickness of the silicon wafer is 30 μm or less, problems such as chipping of a chip and breakage of a chip are likely to occur when the silicon wafer is singulated by blade dicing. In addition thereto, there is a concern that the chip is broken at the time of measurement of the edge peeling strength. On the other hand, for example, in a case where the thickness of the silicon wafer is 80 μm or more, when the silicon wafer is singulated by blade dicing, there is a case where step-cutting has to be applied, and it is hard to select a blade and to set conditions. In addition thereto, when the chip is thick, the chip is less likely to be bent at the time of measurement of the edge peeling strength, and thus there is also a possibility that releasability of the edge becomes favorable and a difference between films is less likely to occur. Furthermore, since a decrease in size of a semiconductor wafer has been advanced in recent years, a silicon wafer having a thickness of 50 μm is used also in terms of matching with market trends.

The reasons why the size of the bonding adhesive piece-attached chip Ta is set to 2 mm×2 mm are as follows. For example, in a case where the size of the bonding adhesive piece-attached chip Ta is set to 1 mm×1 mm, since a distance between the center portion of the chip (a place at which pushing force is applied to the chip) and the edge of the chip is too short, the releasability of the edge becomes favorable, and thus there is a possibility that a difference between films is less likely to occur. In addition to this, since the chip is too small, the center portion of the chip is difficult to be marked, and there is a possibility that a measurement error due to positional deviation occurs in the case of visual inspection without marking. On the other hand, for example, in a case where the size of the bonding adhesive piece-attached chip Ta is set to 3 mm×3 mm, since a distance between the center portion of the chip and the edge of the chip is too long at the time of measurement of the peeling strength of the chip edge portion, pushing force by pushing is hardly to be transferred, and thus the edge peeling strength is difficult to be accurately measured. In addition thereto, a large push amount for peeling off the edge is necessary, and according to this, there is a concern that the chip is largely bent and the breakage of the chip occurs during measurement.

Figure 2C:
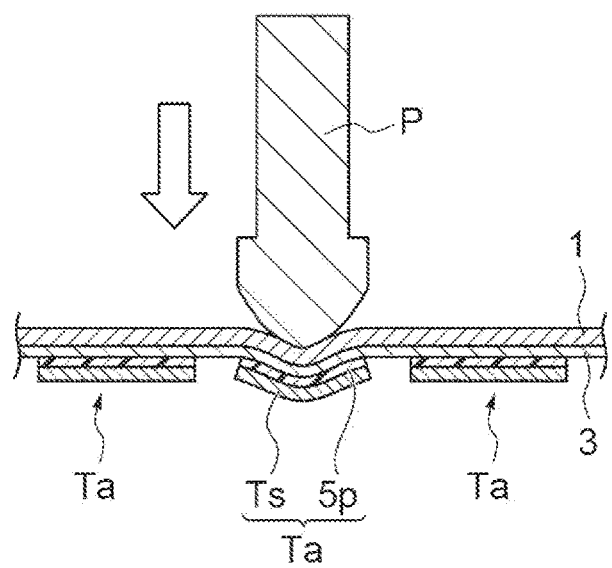

In the process of measuring an edge peeling strength, as illustrated in FIG. 2C, a center portion of the chip Ta is pushed by a push jig P from the side of the base layer 1. For example, the edge peeling strength may be measured under the following conditions by using the following device and the like.

<Measurement Conditions>

Measurement device: compact tabletop tester EZ-SX (manufactured by SHIMADZU CORPORATION)
Load cell: 50 N
Push jig: ZTS series accessory attachment (shape: conical shape, manufactured by IMADA CO., LTD.)
Pushing rate: 60 mm/min
Temperature: 23° C.
Humidity: 45±10%

Figure 3:
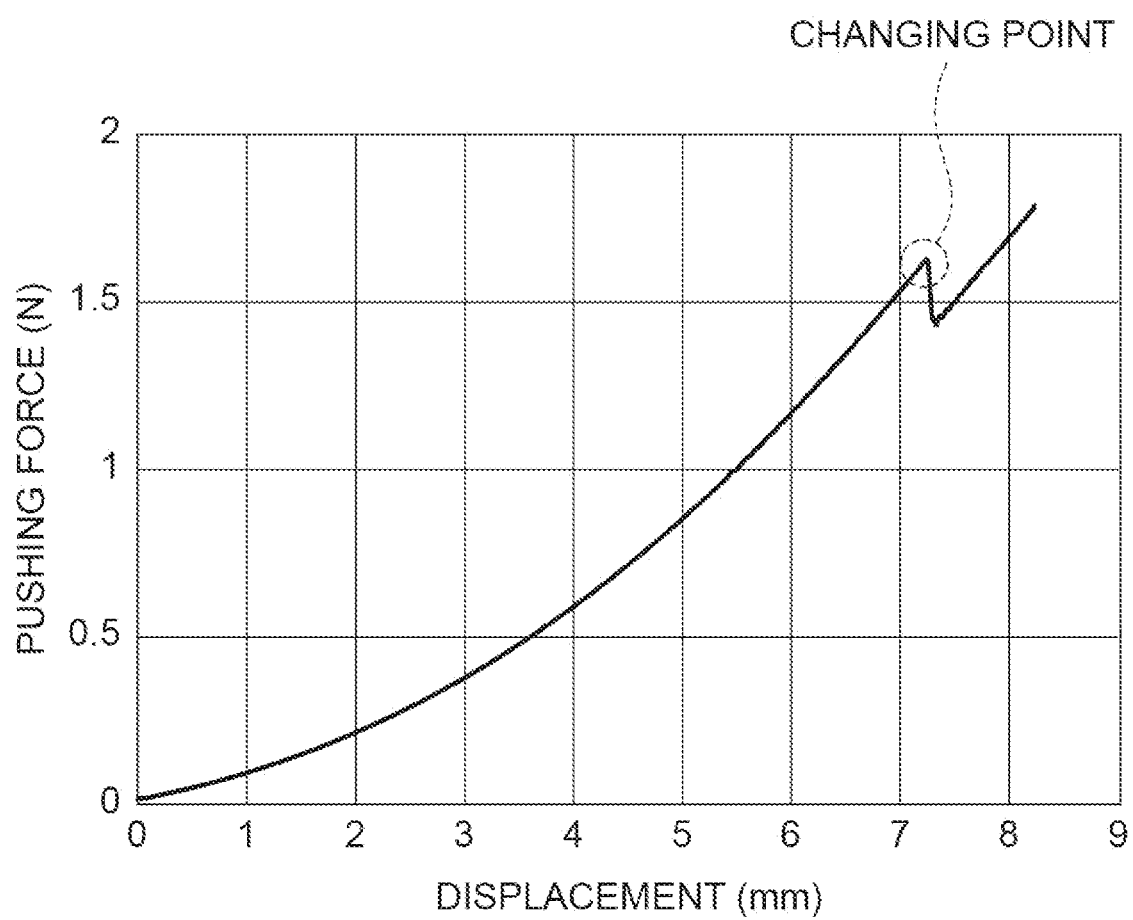
FIG. 3 is a graph showing an example of a relation between a displacement (mm) by pushing and a pushing force (N).

FIG. 3 is a graph showing an example of a relation between a displacement (mm) by pushing and a pushing force (N). When the edge of the chip is peeled off, as shown in FIG. 3, the pushing force is temporarily decreased, and a changing point is generated in the graph. A value of the pushing force at this changing point is regarded as an edge peeling strength.

When the edge peeling strength is measured, a position corresponding to the center portion of the chip Ta in the base layer 1 is preferably marked by using an oil-based ballpoint pen or the like. By marking the position in advance, measurement can be performed with favorable accuracy, and positioning is facilitated so that the measurement efficiency is improved.

The reason why the pushing rate is set to 60 mm/min is as follows. That is, the pushing rate is preferably 60 to 1200 mm/min (1 to 20 mm/sec) in terms of matching with actual pickup conditions, but for example, when the pushing rate is too high, a more pushing force than one needs is applied to a sample until pushing is stopped after the edge is peeled off so that a chip around the chip serving as a measurement target is peeled off or the base layer is torn, and thereby this may adversely affect the subsequent measurement. Therefore, a preferably low pushing rate within the above-described range is selected.

Figure 4:
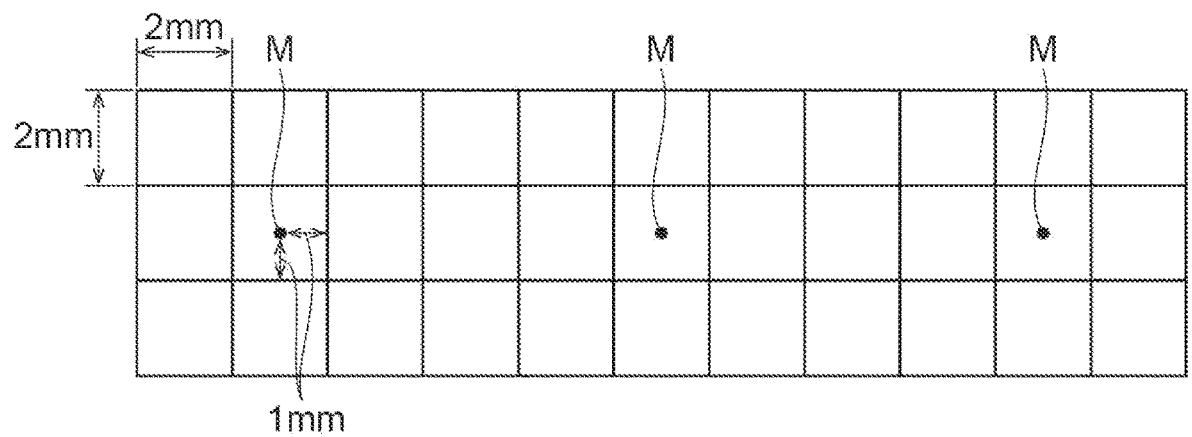
FIG. 4 is a plan view schematically illustrating a state where a mark is made on a position corresponding to a center portion of a chip serving as a measurement target.

It is preferable that the edge peeling strengths of the plurality of chips Ta are measured and an average of a plurality of measurement values is regarded as the edge peeling strength of the film 10. For example, the edge peeling strengths of five or more (more preferably 10 to 20) chips Ta may be measured and an average value thereof may be calculated. In a case where the edge peeling strength of a second chip Ta is measured after the edge peeling strength of a first chip Ta is measured, the second chip Ta is preferably separated sufficiently from the first chip Ta so that pushing of the first chip Ta does not affect the second chip Ta. For example, it is preferable to provide two or more chips Ta between the first chip Ta and the second chip Ta. FIG. 4 is a plan view schematically illustrating a state where a mark M is made on a position corresponding to a center portion of a chip serving as a measurement target. In this drawing, gaps corresponding to three chips are provided between two chips Ta serving as measurement targets.

Figure 5:
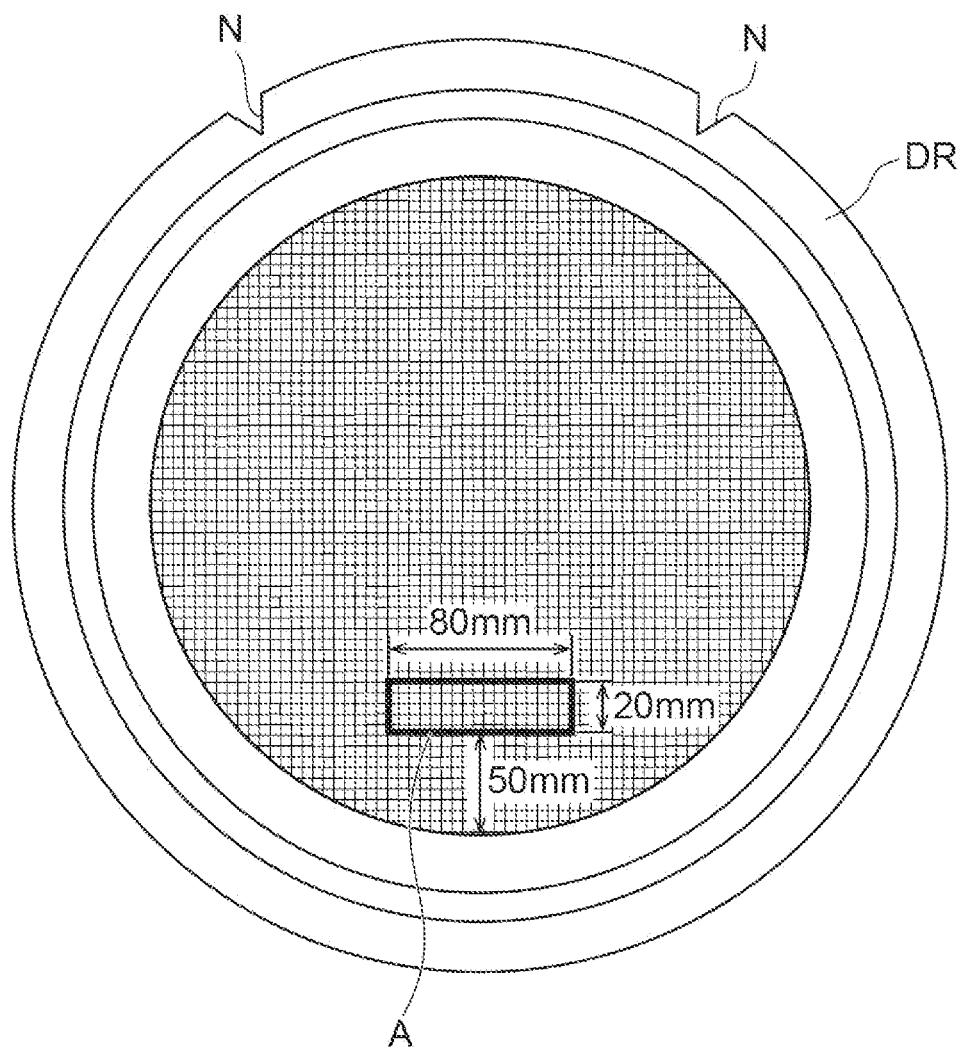
FIG. 5 is a plan view schematically illustrating an example of a measurement area of an edge peeling strength.

In a case where the silicon wafer Ws is a 12-inch wafer, a plurality of chips Ta in a measurement area A illustrated in FIG. 5 is preferably measured. That is, as illustrated in FIG. 5, when the position of a notch N of the dicing ring DR is set to the upper side of the paper sheet, measurement is preferably performed in an area of 80 mm×20 mm away from a lower end portion of the silicon wafer Ws by a distance of 50 mm Since there are difference in tension of the base layer 1 and elongation of the base layer 1 at the time of pushing between the end portion and the center portion of the silicon wafer Ws, there is a possibility that measurement values vary depending on positions. The same settings as those of the measurement area described above may be applied also to the case of an 8-inch wafer. Incidentally, the measurement area A is not limited to the position illustrated in FIG. 5, and for example, the measurement area A may be the upper side, the left side, or the right side in FIG. 5 as long as it is separated from the end portion of the wafer Ws by a predetermined distance.

Incidentally, other than the evaluation of pickup property by the measurement of the edge peeling strength, the pickup property may be evaluated by actually performing pickup with respect to the same sample by using a die bonding apparatus. In this case, the measurement of the edge peeling strength is preferably performed in advance. The picking-up using a die bonding apparatus is typically performed in a state where a base film is expanded. After releasing of the expansion state, there is a case where looseness of the base layer 1 by expansion is not restored, and thus there is a concern that the edge peeling strength is difficult to be measured with high accuracy.

Next, each layer constituting the dicing/die-bonding integrated film will be described.

(Base Layer)

As the base layer 1, known polymer sheets or films can be used, and the base layer 1 is not particularly limited as long as an expansion process can be executed in the base layer even under a low temperature condition. Specifically, examples of polymers constituting the base layer 1 include polyolefins such as crystalline polypropylene, amorphous polypropylene, high-density polyethylene, intermediate-density polyethylene, low-density polyethylene, very low-density polyethylene, low-density linear polyethylene, poly-butene, and polymethylpentene; an ethylene-vinylacetate copolymer; an ionomer resin; an ethylene-(meth)acrylic acid copolymer; an ethylene-(meth)acrylic acid ester (random or alternating) copolymer; an ethylene-butene copolymer; an ethylene-hexene copolymer; polyurethane; polyesters such as polyethylene terephthalate and polyethylene naphthalate; polycarbonate; polyimide; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose-based resin; a silicone resin; or mixtures obtained by mixing a plasticizer with these components or cured products subjected to cross-linkage by electron beam irradiation.

It is preferable that the base layer 1 has a surface having, as a main component, at least one resin selected from polyethylene, polypropylene, a polyethylene-polypropylene random copolymer, and a polyethylene-polypropylene block copolymer, and this surface is in contact with the adhesive layer 3. These resins are favorable base materials also from the viewpoints of characteristics such as a Young's modulus, stress alleviation property, and a melting point, costs, waste material recycle after use, and the like. The base layer 1 may be a single layer, but may have a multi-layered structure in which layers formed by different materials are stacked, as necessary. In order to control adhesiveness with the adhesive layer 3, a surface roughening treatment such as a matting treatment or a corona treatment may be performed with respect to the surface of the base layer 1. The thickness of the base layer 1 is, for example, 10 to 200 µm and may be 20 to 180 µm or 30 to 150 µm.

(Adhesive Layer)

The adhesive layer 3 has a first region 3a including at least a region Rw corresponding to a pasting position of the silicon wafer Ws in the bonding adhesive layer 5, and a second region 3b located to surround the first region 3a. Broken lines in FIG. 1A and FIG. 1B indicate a boundary between the first region 3a and the second region 3b. The first region 3a and the second region 3b are formed by the same composition before irradiation of active energy rays. The first region 3a is a region in a state where the adhesive force is lowered as compared to the second region 3b by irradiation of active energy rays such as ultraviolet rays. The second region 3b is a region to which the dicing ring DR is pasted (see FIG. 2A). The second region 3b is a region which is not irradiated with active energy rays and has high adhesive force with respect to the dicing ring DR.

The thickness of the adhesive layer 3 may be appropriately set according to conditions (such as a temperature and a tension) of the expansion process, and is, for example, 1 to 200 µm and may be 5 to 50 µm or 15 to 45 µm. When the thickness of the adhesive layer 3 is less than 1 µm, adhesion is likely to become insufficient, and when the thickness exceeds 200 µm, a kerf width at the time of expansion is narrow (a stress is alleviated at the time of the pin being thrust up) and picking-up is likely to become insufficient.

Figure 6:
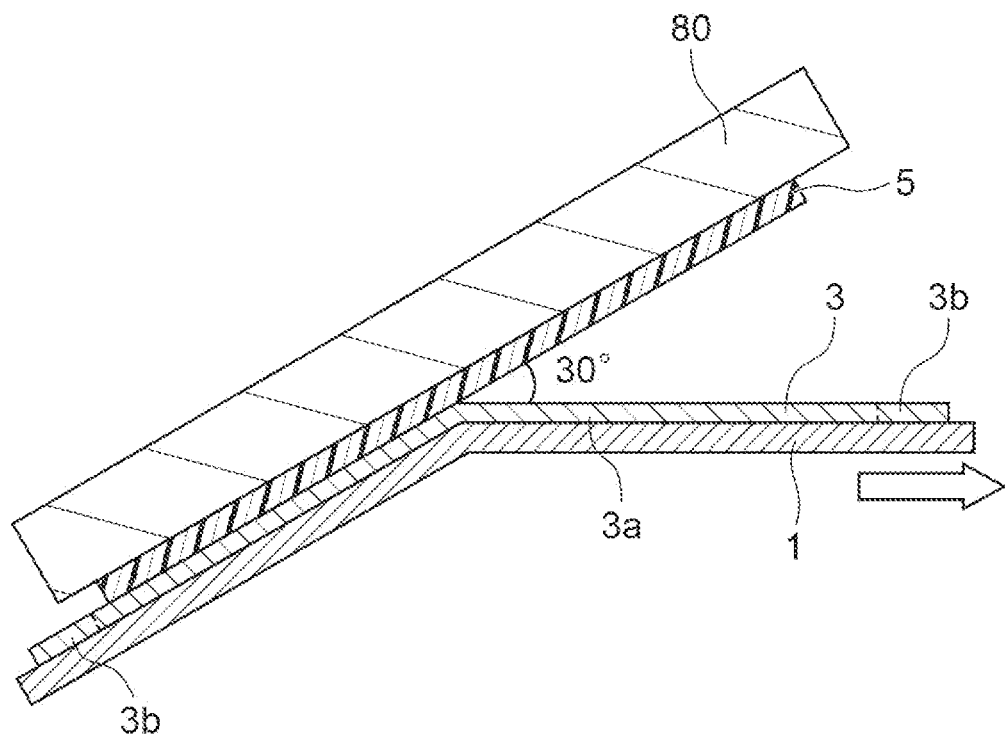
FIG. 6 is a cross-sectional view schematically illustrating a state where a 30° peeling strength of an adhesive layer with respect to a bonding adhesive layer is measured.

The adhesive force of the first region 3a with respect to the bonding adhesive layer 5 is preferably 1.2 N/mm or more and 4.5 N/25 mm or less. This adhesive force is a 30° peeling strength as measured at a temperature of 23° C. under conditions of a peeling angle of 30° and a peeling rate of 60 mm/min. FIG. 6 is a cross-sectional view schematically illustrating a state where a 30° peeling strength of the adhesive layer 3 is measured in a state where the bonding adhesive layer 5 of a measurement sample (width 25 mm×length 100 mm) is fixed to a support plate 80. By setting the adhesive force (30° peeling strength) of the first region 3a with respect to the bonding adhesive layer 5 to the above-described range, both suppression of DAF flying at the time of dicing and excellent pickup property can be sufficiently highly achieved. Thereby, a semiconductor device can be manufactured with a sufficiently high yield. The lower limit value of this adhesive force may be 1.5 N/25 mm or 2.0 N/25 mm, and the upper limit value may be 3.5 N/25 mm or 2.5 N/25 mm The present inventors have focused on a difference between the pickup behavior of a small chip having an area of 9 mm$^2$ or less and the pickup behavior of a large chip, for example, having a size of about 8 mm×6 mm and then conducted studies. In a case where a large chip is picked up by thrusting up a center portion of the large chip from the lower side by a pin of a thrust-up jig, the peeling of the interface between the adhesive layer and the bonding adhesive piece is advanced toward the center portion from the edge of the chip in accordance with the ascending of the pin; however, when the 30° peeling strength of the first region 3a with respect to the bonding adhesive layer is larger than 1.2 N/25 mm, the interface peeling does not follow the ascending of the pin, and thus the chip is excessively deformed to be broken or pickup errors are likely to occur. That is, the present inventors have found out that the pickup property of the large chip is mainly dominated by the peeling of the interface between the adhesive layer 3 and the bonding adhesive piece, and the adhesive force of the adhesive layer with respect to the bonding adhesive layer has to be set to, for example, less than 1.2 N/25 mm. On the other hand, the present inventors have found out that the pickup property of the small chip is mainly dominated by the peeling of the edge portion of the bonding adhesive piece-attached chip, and if peeling of the edge portion occurs once due to thrusting-up by the pin, the peeling of the interface between the adhesive layer 3 and the bonding adhesive piece 5p is smoothly advanced thereafter. Therefore, even when the adhesive force of the first region 3a with respect to the bonding adhesive layer 5 is relatively strong, in the case of a small chip, excellent pickup property can be achieved. Furthermore, when the adhesive force of the first region 3a with respect to the bonding adhesive layer 5 is relatively strong, DAF flying in the dicing process can be sufficiently suppressed.

The first region 3a has adhesive force in the above-described range with respect to the bonding adhesive layer 5 and is formed by irradiation of active energy rays. The present inventors have found out that lowering of the adhesive force of the adhesive layer 3 by irradiation of active energy rays affects the edge peeling strength of the bonding adhesive piece-attached chip. That is, when the adhesive force of the first region 3a is excessively lowered by irradiation of active energy rays, the 30° peeling strength of the first region 3a with respect to the bonding adhesive layer 5 is decreased; on the other hand, in a case where a target to be picked up is a small chip, there is a tendency that the edge of the bonding adhesive piece-attached chip is less likely to be peeled off, and thus the chip is excessively deformed to be broken or pickup errors are likely to occur. Regarding the adhesive force of the first region 3a with respect to the bonding adhesive layer 5, it is preferable that the adhesive force before irradiation of active energy rays is not excessively lowered, and thereby even in the case of a bonding adhesive piece-attached chip having an area of 9 mm$^2$ or less, the edge thereof is easily peeled off from the adhesive layer 3 (the first region 3a). In the present embodiment, the adhesive force of the first region 3a of the adhesive layer 3 can be adjusted, for example, by relatively decreasing the amount of the cross-linking agent in the adhesive layer 3, lowering the irradiance level of active energy rays, or the like.

The adhesive force of the second region 3b with respect to a stainless steel substrate is preferably 0.2 N/25 mm or more. This adhesive force is a 90° peeling strength as measured at a temperature of 23° C. under conditions of a peeling angle of 90° and a peeling rate of 50 mm/min. When this adhesive force is 0.2 N/25 mm or more, ring peeling at the time of dicing can be sufficiently suppressed. The lower limit value of this adhesive force may be 0.3 N/25 mm or 0.4 N/25 mm, and the upper limit value is, for example, 2.0 N/25 mm and may be 1.0 N/25 mm The adhesive layer before irradiation of active energy rays is, for example, formed by an adhesive composition containing a (meth)acrylic resin, a photopolymerization initiator, and a cross-linking agent. The second region 3b which is not irradiated with active energy rays is formed by the same composition as that of the adhesive layer before irradiation of active energy rays. Hereinafter, components contained in the adhesive composition will be specifically described.

[(Meth)Acrylic Resin]

The adhesive composition contains a (meth)acrylic resin having a chain polymerizable functional group, and the functional group is preferably at least one selected from an acryloyl group and a methacryloyl group. The content of the functional group in the adhesive layer before irradiation of active energy rays is, for example, 0.1 to 1.2 mmol/g, and may be 0.3 to 1.0 mmol/g or 0.5 to 0.8 mmol/g. When the content of the functional group is 0.1 mmol/g or more, a region (first region 3a) whose adhesive force is properly lowered by irradiation of active energy rays is easily formed; on the other hand, when the content thereof is 1.2 mmol/g or less, excellent pickup property is easily achieved.

The (meth)acrylic resin can be obtained by performing synthesis according to a known method. Examples of the synthesis method include a solution polymerization method, a suspension polymerization method, an emulsion polymerization method, a bulk polymerization method, a precipitation polymerization method, a gas-phase polymerization method, a plasma polymerization method, and a supercritical polymerization method. Furthermore, as the type of polymerization reaction, methods such as ATRP (atom transfer radical polymerization) and RAFT (reversible addition-fragmentation chain transfer polymerization) are exemplified in addition to radical polymerization, cationic polymerization, anionic polymerization, living radical polymerization, living cationic polymerization, living anionic polymerization, coordination polymerization, immortal polymerization, and the like. Of these, synthesis by radical polymerization using a solution polymerization method has advantages in that a resin solution obtained by polymerization can be used without any changes and then can be mixed, in addition to the merits of economic efficiency, a high reaction rate, ease of polymerization control, and the like.

Herein, a method of synthesizing a (meth)acrylic resin will be specifically described by using, as an example, a method of obtaining a (meth)acrylic resin by radical polymerization using a solution polymerization method.

The monomer used when a (meth)acrylic resin is synthesized is not particularly limited as long as it has one (meth)acryloyl group in one molecule. Specific examples thereof include aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, methoxypolyethylene glycol (meth)acrylate, ethoxypolyethylene glycol (meth)acrylate, methoxypolypropylene glycol (meth)acrylate, ethoxypolypropylene glycol (meth)acrylate, and mono(2-(meth)acryloyloxyethyl)succinate; alicyclic (meth)acrylates such as cyclopentyl (meth)acrylate, cyclohexyl (meth)acrylate, cyclopentyl (meth)acrylate, dicyclopentanyl (meth)acrylate, dicyclopentenyl (meth)acrylate, isobornyl (meth)acrylate, mono(2-(meth)acryloyloxyethyl)tetrahydrophthalate, and mono(2-(meth)acryloyloxyethyl)hexahydrophthalate; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxypolyethylene glycol (meth)acrylate, nonylphenoxypolyethylene glycol (meth)acrylate, phenoxypolypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate; heterocyclic (meth)acrylates such as 2-tetrahydrofurfuryl (meth)acrylate, N-(meth)acryloyloxyethylhexahydrophthalimide, and 2-(meth)acryloyloxyethyl-N-carbazole, and caprolactone-modified products thereof; compounds having an ethylenically unsaturated group and an epoxy group such as o-carboxy-polycaprolactone mono(meth)acrylate, glycidyl (meth)acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-epoxybutyl (meth)acrylate, 3,4-epoxyheptyl (meth)acrylate, α-ethyl-6,7-epoxyheptyl (meth)acrylate, 3,4-epoxycyclohexylmethyl (meth)acrylate, o-vinylbenzylglycidyl ether, m-vinylbenzylglycidyl ether, and p-vinylbenzylglycidyl ether; compounds having an ethylenically unsaturated group and an oxetanyl group such as (2-ethyl-2-oxetanyl)methyl (meth)acrylate, (2-methyl-2-oxetanyl)methyl (meth)acrylate, 2-(2-ethyl-2-oxetanyl)ethyl (meth)acrylate, 2-(2-methyl-2-oxetanyl)ethyl (meth)acrylate, 3-(2-ethyl-2-oxetanyl)propyl (meth)acrylate, and 3-(2-methyl-2-oxetanyl)propyl (meth)acrylate; compounds having an ethylenically unsaturated group and an isocyanate group such as 2-(meth)acryloyloxyethyl isocyanate; and compounds having an ethylenically unsaturated group and a hydroxyl group such as 2-hydroxyethyl (meth)acrylate, 2-hydroxypropyl (meth)acrylate, 4-hydroxybutyl (meth)acrylate, 3-chloro-2-hydroxypropyl (meth)acrylate, and 2-hydroxybutyl (meth)acrylate, and target (meth)acrylic resins can be obtained by appropriately combining these compounds.

The (meth)acrylic resin preferably has at least one functional group selected from a hydroxyl group, a glycidyl group, an amino group, and the like, as a reactive site with a functional group-introduced compound or a cross-linking agent described below. Examples of a monomer for synthesizing a (meth)acrylic resin having a hydroxyl group include compounds having an ethylenically unsaturated group and a hydroxyl group such as 2-hydroxyethyl (meth)acrylate, 2-hydroxypropyl (meth)acrylate, 4-hydroxybutyl (meth)acrylate, 3-chloro-2-hydroxypropyl (meth)acrylate, and 2-hydroxybutyl (meth)acrylate, and these can be used alone or can be used in combination of two or more kinds thereof.

Examples of a monomer for synthesizing a (meth)acrylic resin having a glycidyl group include compounds having an ethylenically unsaturated group and an epoxy group such as glycidyl (meth)acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-epoxybutyl (meth)acrylate, 3,4-epoxyheptyl (meth)acrylate, α-ethyl-6,7-epoxyheptyl (meth)acrylate, 3,4-epoxycyclohexylmethyl (meth)acrylate, o-vinylbenzylglycidyl ether, m-vinylbenzylglycidyl ether, and p-vinylbenzylglycidyl ether, and these can be used alone or can be used in combination of two or more kinds thereof.

The (meth)acrylic resins synthesized from these monomers preferably contain a chain polymerizable functional group. The chain polymerizable functional group is, for example, at least one selected from an acryloyl group and a methacryloyl group. The chain polymerizable functional group can be introduced into a (meth)acrylic resin, for example, by reacting the following compounds (functional group-introduced compounds) with the (meth)acrylic resin synthesized as described above. Specific examples of the functional group-introduced compounds include 2-methacryloyloxyethyl isocyanate, meta-isopropenyl-α,α-dimethylbenzyl isocyanate, methacryloyl isocyanate, allyl isocyanate, 1,1-(bisacryloyloxymethyl)ethyl isocyanate; an acryloyl monoisocyanate compound obtained by reacting a diisocyanate compound or a polyisocyanate compound with a hydroxyethyl (meth)acrylate or 4-hydroxybutyl ethyl (meth)acrylate; and an acryloyl monoisocyanate compound obtained by reacting a diisocyanate compound or a polyisocyanate compound, a polyol compound, and hydroxyethyl (meth)acrylate. Of these, particularly, 2-methacryloyloxyethyl isocyanate is preferred. These compounds can be used alone or can also be used in combination of two or more kinds thereof.

The weight average molecular weight (Mw) of the (meth)acrylic resin is, for example, 100000 to 2000000 or more, preferably 150000 to 1000000, and more preferably 200000 to 800000. When the weight average molecular weight (Mw) of the (meth)acrylic resin is in such a range, the adhesive layer 3, which has excellent adhesion and a small amount of a low-molecular-weight component and can prevent contamination of an adherend, can be formed.

The hydroxyl value of the (meth)acrylic resin is preferably 10 to 150 mgKOH/g and more preferably 20 to 100 mgKOH/g. When the hydroxyl value of the (meth)acrylic resin is in the above-described range, initial adhesive force can be adjusted by reaction with a cross-linking agent, and an effect that peeling force after reaction of the chain polymerizable functional group is lowered is exhibited.

[Photopolymerization Initiator]

The photopolymerization initiator is not particularly limited as long as it generates a chain polymerizable active species by irradiation of active energy rays (at least one selected from ultraviolet rays, electron beams, and visible rays), and for example, a photoradical polymerization initiator is exemplified. Herein, the chain polymerizable active species means one which reacts with a chain polymerizable functional group to start a polymerization reaction.

Examples of the photoradical polymerization initiator include benzoin ketals such as 2,2-dimethoxy-1,2-diphenylethane-1-one; α-hydroxyketones such as 1-hydroxycyclohexylphenylketone, 2-hydroxy-2-methyl-1-phenylpropan-1- one, and 1-[4-(2-hydroxyethoxy)phenyl]-2-hydroxy-2-methyl-1-propan-1-one; α-aminoketones such as 2-benzyl-2-dimethylamino-1-(4-morpholinophenyl)-butan-1-one and 1,2-methyl-1-[4-(methylthio)phenyl]-2-morpholinopropan-1-one; oxime esters such as 1-[4-(phenylthio)phenyl]-1,2-octadione-2-(benzoyl)oxime; phosphine oxides such as bis(2,4,6-trimethylbenzoyl)phenylphosphine oxide, bis(2,6-dimethoxybenzoyl)-2,4,4-trimethylpentylphosphine oxide, and 2,4,6-trimethylbenzoyldiphenylphosphine oxide; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; benzophenone compounds such as benzophenone, N,N'-tetramethyl-4,4'-diaminobenzophenone, N,N'-tetraethyl-4,4'-diaminobenzophenone, and 4-methoxy-4'-dimethylaminobenzophenone; quinone compounds such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloro anthraquinone, 2-methylanthraquinone, 1,4-naphthoquinone, 9,10-phenanthraquinone, 2-methyl-1,4-naphthoquinone, and 2,3-dimethylanthraquinone; benzoin ethers such as benzoin methyl ether, benzoin ethyl ether, and benzoin phenyl ether; benzoin compounds such as benzoin, methyl benzoin, and ethyl benzoin; benzyl compounds such as benzyl dimethyl ketal; acridine compounds such as 9-phenylacridine and 1,7-bis(9,9'-acridinyl heptane); and N-phenylglycine and coumarin.

The content of the photopolymerization initiator in the adhesive composition is, for example, 0.1 to 30 parts by mass, preferably 0.3 to 10 parts by mass, and more preferably 0.5 to 5 parts by mass, with respect to 100 parts by mass of the content of the (meth)acrylic resin. When the content of the photopolymerization initiator is less than 0.1 parts by mass, the adhesive layer is not sufficiently cured after irradiation of active energy rays, and thus a pickup failure is likely to occur. When the content of the photopolymerization initiator exceeds 30 parts by mass, contamination of the bonding adhesive layer (transfer of the photopolymerization initiator to the bonding adhesive layer) is likely to occur.

[Cross-Linking Agent]

The cross-linking agent is used for controlling the elastic modulus and/or adhesion of the adhesive layer, for example. The cross-linking agent may be a compound having, in one molecule, two or more functional groups which can react with at least one functional group selected from a hydroxyl group, a glycidyl group, an amino group, and the like of the above-described (meth)acrylic resin. Examples of a bond to be formed by reaction between the cross-linking agent and the (meth)acrylic resin include an ester bond, an ether bond, an amide bond, an imide bond, a urethane bond, and a urea bond.

In the present embodiment, as the cross-linking agent, a compound having two or more isocyanate groups in one molecule is preferably adopted. When such a compound is used, the cross-linking agent easily reacts with a hydroxyl group, a glycidyl group, an amino group, and the like of the (meth)acrylic resin, and thereby a strong cross-linked structure can be formed.

Examples of the compound having two or more isocyanate groups in one molecule include isocyanate compounds such as 2,4-tolylene diisocyanate, 2,6-tolylene diisocyanate, 1,3-xylylene diisocyanate, 1,4-xylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, and lysine isocyanate.

As the cross-linking agent, a reaction product between the above-described isocyanate compound and a polyhydric alcohol having two or more OH groups in one molecule (an isocyanate group-containing oligomer) may be adopted. Examples of the polyhydric alcohol having two or more OH groups in one molecule include ethylene glycol, propylene glycol, butylene glycol, 1,6-hexanediol, 1,8-octanediol, 1,9-nonanediol, 1,10-decanediol, 1,11-undecanediol, 1,12-dodecanediol, glycerin, pentaerythritol, dipentaerythritol, 1,4-cyclohexanediol, and 1,3-cyclohexanediol.

Of these, the cross-linking agent is further desirably a reaction product between a polyfunctional isocyanate having two or more isocyanate groups in one molecule and a polyhydric alcohol having three or more OH groups in one molecule (an isocyanate group-containing oligomer). By using such an isocyanate group-containing oligomer as a cross-linking agent, the adhesive layer 3 forms a dense cross-linked structure, and thereby adhesion of the adhesive to the bonding adhesive layer 5 in the pickup process can be sufficiently suppressed.

The content of the cross-linking agent in the adhesive composition may be appropriately set according to cohesion force and elongation rate at break required for the adhesive layer, adhesiveness with the bonding adhesive layer 5, and the like. Specifically, the content of the cross-linking agent is, for example, 2 to 30 parts by mass and may be 4 to 15 parts by mass or 7 to 10 parts by mass, with respect to 100 parts by mass of the content of the (meth)acrylic resin. When the content of the cross-linking agent is set in the above-described range, a property required for the adhesive layer in the dicing process and a property required for the adhesive layer 3 in the die bonding process can be achieved in a balanced manner, and excellent pickup property can be achieved.

When the content of the cross-linking agent is less than 2 parts by mass with respect to 100 parts by mass of the content of the (meth)acrylic resin, the formation of the cross-linked structure is likely to become insufficient, and thereby the sticking force of the interface with the bonding adhesive layer 5 is not sufficiently lowered in the pickup process, and thus defects are likely to occur at the time of picking-up. On the other hand, when the content of the cross-linking agent exceeds 30 parts by mass with respect to 100 parts by mass of the content of the (meth)acrylic resin, the adhesive layer 3 is likely to be excessively cured, and thereby a semiconductor chip is likely to be peeled off in the expansion process.

The content of the cross-linking agent is, for example, 0.1 to 20% by mass and may be 2 to 17% by mass or 3 to 15% by mass, with respect to the total mass of the adhesive composition. When the content of the cross-linking agent is 0.1% by mass or more, a region (first region 3a) whose adhesive force is properly lowered by irradiation of active energy rays is easily formed; on the other hand, when the content thereof is 15% by mass or less, excellent pickup property is easily achieved.

As a method of forming the adhesive layer 3, a known method can be adopted. For example, a laminate of the base layer 1 and the adhesive layer 3 may be formed by a two layer extrusion method, and a varnish for forming the adhesive layer 3 may be prepared and applied to the surface of the base layer 1 or the adhesive layer 3 may be formed on a film subjected to a mold release treatment and transferred to the base layer 1.

The varnish for forming the adhesive layer 3 is preferably prepared by using an organic solvent that can dissolve the (meth)acrylic resin, the photopolymerization initiator, and the cross-linking agent and volatilizes by heating. Specific examples of the organic solvent include aromatic hydrocarbons such as toluene, xylene, mesitylene, cumene, and p-cymene; cyclic ethers such as tetrahydrofuran and 1,4-dioxane; alcohols such as methanol, ethanol, isopropanol, butanol, ethylene glycol, and propylene glycol; ketones such as acetone, methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic esters such as ethylene carbonate and propylene carbonate; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, and diethylene glycol diethyl ether; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, and diethylene glycol monoethyl ether acetate; and amides such as N,N-dimethylformamide, N,N-dimethylacetamide, and N-methylpyrrolidone.

Of these, from the viewpoint of solubility and a boiling point, for example, toluene, methanol, ethanol, isopropanol, acetone, methyl ethyl ketone, methyl isobutyl ketone, cyclohexanone, methyl acetate, ethyl acetate, butyl acetate, ethylene glycol monomethyl ether, ethylene glycol monoethyl ether, propylene glycol monomethyl ether, propylene glycol monoethyl ether, diethylene glycol dimethyl ether, ethylene glycol monomethyl ether acetate, propylene glycol monomethyl ether acetate, N,N-dimethylacetamide, and acetylacetone are preferred. These organic solvents may be used alone or may be used in combination of two or more kinds thereof. The solid content concentration of the varnish is generally preferably 10 to 60% by mass.

(Bonding Adhesive Layer)

A known bonding adhesive composition constituting a die bonding film can be applied to the bonding adhesive layer 5. Specifically, a bonding adhesive composition constituting the bonding adhesive layer 5 preferably contains an epoxy group-containing acrylic copolymer, an epoxy resin, and an epoxy resin curing agent. According to the bonding adhesive layer 5 containing these components, there are characteristics that adhesiveness between a chip and a substrate and between chips is excellent, electrode embeddability, wire embeddability, and the like can also be imparted, adhesion can be performed at a low temperature in the die bonding process, excellent curing is obtainable in a short time, excellent reliability is obtained after molding with a sealing agent, and the like, which are preferable.

The thickness of the bonding adhesive layer 5 is, for example, 1 to 300 μm and preferably 5 to 150 μm and may be 10 to 100 μm or 15 to 35 μm. When the thickness of the bonding adhesive layer 5 is less than 1 μm, adhesiveness is likely to become insufficient; on the other hand, when the thickness thereof exceeds 300 μm, dicing property and pickup property are likely to become insufficient.

Examples of the epoxy resin include a bisphenol A type epoxy resin, a bisphenol F type epoxy resin, a bisphenol S type epoxy resin, an alicyclic epoxy resin, an linear aliphatic epoxy resin, a phenol novolak type epoxy resin, a cresol novolak type epoxy resin, a bisphenol A novolak type epoxy resin, a diglicidyletherified product of biphenol, a diglicidyletherified product of naphthalenediol, a diglicidyletherified product of phenols, a diglycidyletherified product of alcohols, and a bifunctional epoxy resin of an alkyl-substitution product, halide, hydrogen additive, or the like of these materials, and a novolak type epoxy resin. Furthermore, generally known other epoxy resins such as a polyfunctional epoxy resin and a heterocyclic ring-containing epoxy resin may be applied. These can be used alone or can be used in combination of two or more kinds thereof. Incidentally, components other than the epoxy resins may be contained as impurities in a range that does not impair properties.

As the epoxy resin curing agent, for example, those like a phenolic resin that can be obtained by reacting a phenolic compound with a xylylene compound, which is a bivalent linking group, in the absence of a catalyst or in the presence of an acid catalyst are exemplified. Examples of the phenolic compound used in the production of the phenolic resin include phenol, o-cresol, in-cresol, p-cresol, o-ethylphenol, p-ethylphenol, o-n-propylphenol, m-n-propylphenol, p-n-propylphenol, o-isopropylphenol, m-isopropylphenol, p-isopropylphenol, o-n-butylphenol, m-n-butylphenol, p-n-butylphenol, o-isobutylphenol, m-isobutylphenol, p-isobutylphenol, octylphenol, nonylphenol, 2,4-xylenol, 2,6-xylenol, 3,5-xylenol, 2,4,6-trimethylphenol, resorcin, catechol, hydroquinone, 4-methoxyphenol, o-phenylphenol, m-phenylphenol, p-phenylphenol, p-cyclohexylphenol, o-allylphenol, p-allylphenol, o-benzylphenol, p-benzylphenol, o-chlorophenol, p-chlorophenol, o-bromophenol, p-bromophenol, o-iodophenol, p-iodophenol, o-fluorophenol, m-fluorophenol, and p-fluorophenol. These phenolic compounds may be used alone or may be used as a mixture of two or more kinds thereof. As the xylylene compound, which is a bivalent linking group, used in the production of the phenolic resin, xylylene dihalide, xylylene diglycol, and a derivative thereof listed below can be used. That is, examples thereof include α,α'-dichloro-p-xylene, α,α'-dichloro-m-xylene, α,α'-dichloro-o-xylene, α,α'-dibromo-p-xylene, α,α'-dibromo-m-xylene, α,α'-dibromo-o-xylene, α,α'-diiodo-p-xylene, α,α'-diiodo-m-xylene, α,α'-diiodo-o-xylene, α,α'-dihydroxy-p-xylene, α,α'-dihydroxy-m-xylene, α,α'-dihydroxy-o-xylene, α,α'-dimethoxy-p-xylene, α,α'-dimethoxy-m-xylene, α,α'-dimethoxy-o-xylene, α,α'-diethoxy-p-xylene, α,α'-diethoxy-m-xylene, α,α'-diethoxy-o-xylene, α,α'-di-n-propoxy-p-xylene, α,α'-di-n-propoxy-m-xylene, α,α'-di-n-propoxy-o-xylene, α,α'-di-isopropoxy-p-xylene, α,α'-diisopropoxy-m-xylene, α,α'-diisopropoxy-o-xylene, α,α'-di-n-butoxy-p-xylene, α,α'-di-n-butoxy-m-xylene, α,α'-di-n-butoxy-o-xylene, α,α'-diisobutoxy-p-xylene, α,α'-diisobutoxy-m-xylene, α,α'-diisobutoxy-o-xylene, α,α'-di-tert-butoxy-p-xylene, α,α'-di-tert-butoxy-m-xylene, and α,α'-di-tert-butoxy-o-xylene. These can be used alone or can be used in combination of two or more kinds thereof.

When the phenolic compound and the xylylene compound described above are reacted with each other, the reaction can be performed by using an acidic catalyst such as mineral acids such as hydrochloric acid, sulfuric acid, phosphoric acid, and polyphosphoric acid; organic carboxylic acids such as dimethyl sulphate, diethyl sulphate, p-toluenesulfonic acid, methanesulfonic acid, and ethanesulfonic acid; superacids such as trifluoromethanesulfonic acid; strong acid ion-exchange resins such as an alkanesulfonic acid type ion-exchange resin; superacid type ion-exchange resins such as a perfluoroalkanesulfonic acid type ion-exchange resin (trade name: Nafion manufactured by Du Pont, "Nafion" is the registered trademark); natural and synthetic zeolites; and activated clay (acid clay), until the xylylene compound serving as a raw material substantially disappears at 50° C. to 250° C. and the reaction composition becomes constant. Although depending on a raw material and a reaction temperature, a reaction time is approximately 1 to 15 hours, and in practice, may be decided while following a reaction composition by GPC (gel permeation chromatography) or the like.

The epoxy group-containing acrylic copolymer is preferably a copolymer obtained by using glycidyl acrylate or glycidyl methacrylate as a raw material in an amount of 0.5 to 6% by mass with respect to a copolymer to be obtained. When this amount is 0.5% by mass or more, high adhesive force is easily obtained; on the other hand, when this amount is 6% by mass or less, gelation can be suppressed. For the remaining part, alkyl acrylates having an alkyl group having 1 to 8 carbon atoms, such as methyl acrylate or methyl methacrylate, and a mixture of alkyl methacrylate, styrene, acrylonitrile, and the like can be used. Of these, ethyl (meth)acrylate and/or butyl (meth)acrylate are particularly preferable. The mixing ratio is preferably adjusted in consideration of Tg of the copolymer. When Tg is lower than −10° C., the tackiness of the bonding adhesive layer 5 in the B-stage state tends to increase, and handleability tends to deteriorate. Incidentally, the upper limit value of the glass transition point (Tg) of the epoxy group-containing acrylic copolymer is, for example, 30° C. The polymerization method is not particularly limited, and for example, pearl polymerization and solution polymerization are exemplified. As a commercially available epoxy group-containing acrylic copolymer, for example, HTR-860P-3 (trade name, manufactured by Nagase ChemteX Corporation) is exemplified.

The weight average molecular weight of the epoxy group-containing acrylic copolymer is 100000 or more, when the weight average molecular weight is in this range, adhesiveness and heat resistance are high, and the weight average molecular weight is preferably 300000 to 3000000 and more preferably 500000 to 2000000. When the weight average molecular weight is 3000000 or less, a decrease in fillability between a semiconductor chip and a substrate supporting the semiconductor chip can be suppressed. The weight average molecular weight is a value in terms of polystyrene using a calibration curve of standard polystyrene by gel permeation chromatography (GPC).

The bonding adhesive layer 5 may further contain, as necessary, curing accelerators such as tertiary amine, imidazoles, and quaternary ammonium salts. Specific examples of the curing accelerator include 2-methylimidazole, 2-ethyl-4-methylimidazole, 1-cyanoethyl-2-phenylimidazole, and 1-cyanoethyl-2-phenylimidazolium trimellitate. These may be used alone or may be used in combination of two or more kinds thereof.

The bonding adhesive layer 5 may further contain, as necessary, an inorganic filler. Specific examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, and amorphous silica. These may be used alone or may be used in combination of two or more kinds thereof.

Incidentally, the bonding adhesive layer 5 may be an embodiment not including a thermosetting resin. For example, in a case where the bonding adhesive layer 5 contains a reactive group-containing (meth)acrylic copolymer, it is sufficient that the bonding adhesive layer 5 contains a reactive group-containing (meth)acrylic copolymer, a curing accelerator, and a filler.

<Method for Producing Dicing/Die-Bonding Integrated Film>

The method for producing the film 10 includes a process of producing a laminate, which includes an adhesive layer formed by an adhesive composition whose adhesive force is lowered by irradiation of active energy rays and the bonding adhesive layer 5 formed on the surface of the adhesive layer, on the surface of the base layer 1, and a process of irradiating a region that becomes the first region 3a of the adhesive layer included in the laminate in order. The irradiance level of active energy rays with respect to the region that becomes the first region 3a is, for example, 10 to 1000 mJ/cm$^2$ and may be 100 to 700 mJ/cm$^2$ or 200 to 500 mJ/cm$^2$.

In the above-described manufacturing method, a laminate of the adhesive layer and the bonding adhesive layer 5 is produced in advance, and then a specific region of the adhesive layer is irradiated with active energy rays. As described below, the first region 3a may be formed by irradiating the adhesive layer with active energy rays before being pasted with the bonding adhesive layer 5. That is, the method for producing the film 10 may include a process of forming an adhesive layer formed by a composition whose adhesive force is lowered by irradiation of active energy rays, on the surface of the base layer 1, a process of irradiating a region that becomes the first region 3a of the adhesive layer with active energy rays, and a process of stacking the bonding adhesive layer 5 on the surface of the adhesive layer 3 after irradiation of active energy rays, in order.

<Semiconductor Device and Manufacturing Method Therefor>

Figure 7:
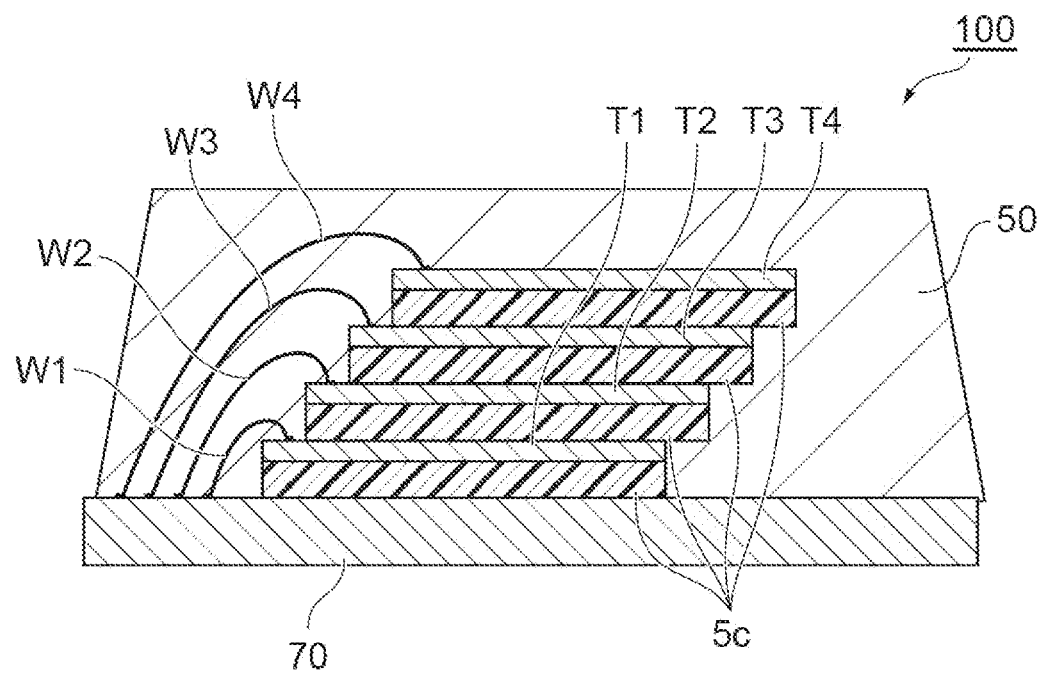
FIG. 7 is a schematic cross-sectional view illustrating an embodiment of a semiconductor device.

FIG. 7 is a cross-sectional view schematically illustrating a semiconductor device of the present embodiment. A semiconductor device 100 illustrated in this drawing includes a substrate 70, four chips T1, T2, T3, and T4 stacked on a surface of the substrate 70, wires W1, W2, W3, and W4 electrically connecting an electrode (not illustrated) on the surface of the substrate 70 to the four chips T1, T2, T3, and T4, and a sealing layer 50 covering these components.

The substrate 70 is, for example, an organic substrate and may be a metal substrate such as a lead frame. Regarding the substrate 70, from the viewpoint of suppressing the bowing of the semiconductor device 100, the thickness of the substrate 70 is, for example, 70 to 140 μm and may be 80 to 100 μm.

The four chips T1, T2, T3, and T4 are stacked via a cured product 5c of the bonding adhesive piece 5p. The shape of the chips T1, T2, T3, and T4 in plan view is, for example, a square shape or a rectangular shape. The area of the chips T1, T2, T3, and T4 is 9 mm$^2$ or less and may be 0.1 to 4 mm$^2$ or 0.1 to 2 mm$^2$, The length of one side of the chips T1, T2, T3, and T4 is, for example, 3 mm or less and may be 0.1 to 2.0 mm and 0.1 to 1.0 mm. The thickness of the chips T1, T2, T3, and T4 is, for example, 10 to 170 μm and may be 25 to 100 μm. Incidentally, the lengths of one sides of the four chips T1, T2, T3, and T4 may be the same as or different from one another, and the same applies the thickness.

Figure 8A:
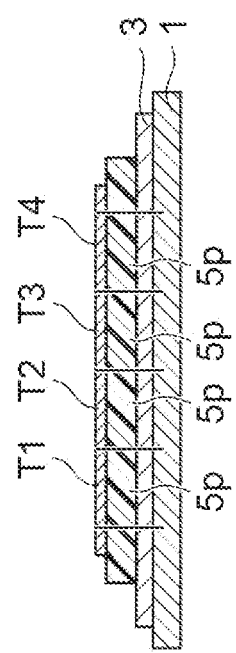
FIG. 8A to FIG. 8D are cross-sectional views schematically illustrating a process of manufacturing a bonding adhesive piece-attached chip.
Figure 8C:
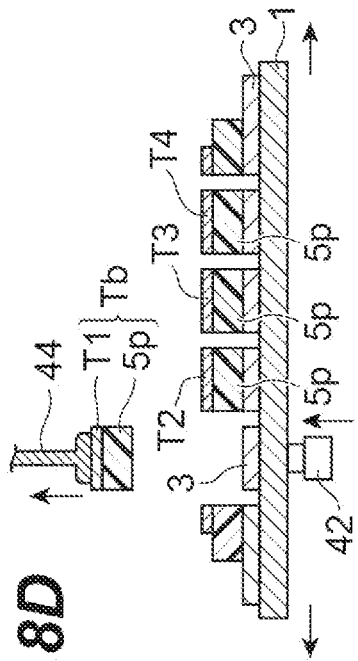
Figure 8B:
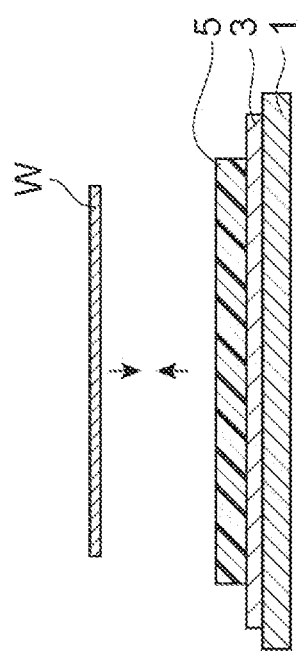
Figure 8D:
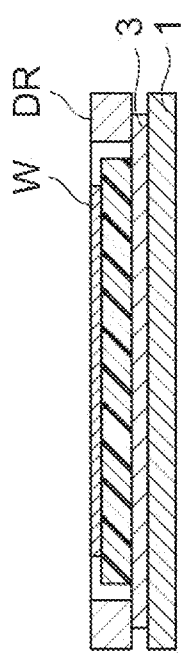

The method for manufacturing the semiconductor device 100 includes a process of preparing the above-described film 10, a process of pasting the wafer W to the bonding adhesive layer 5 of the film 10 and pasting the dicing ring DR to the second surface F2 of the adhesive layer 3, a process of singulating the wafer W into a plurality of chips T1, T2, T3, and T4 having an area of 9 mm² or less (dicing process), a process of picking up a bonding adhesive piece-attached chip Tb (a laminate of the chip and the bonding adhesive piece 5p, see FIG. 8D) from the first region 3a of the adhesive layer 3, and a process of mounting the chip T1 on the substrate 70 through the bonding adhesive piece 5p.

An example of the method for producing the bonding adhesive piece-attached chip Tb will be described with reference to FIG. 8A to FIG. 8D. First, the above-described film 10 is prepared. As illustrated in FIG. 8A and FIG. 8B, the film 10 is pasted so that the bonding adhesive layer 5 is in contact with one surface of the wafer W. Furthermore, the dicing ring DR is pasted to the second surface F2 of the adhesive layer 3.

The wafer W, the bonding adhesive layer 5, and the adhesive layer 3 are diced. Thereby, as illustrated in FIG. 8C, the wafer W is singulated to obtain the chips T1, T2, T3, and T4. The bonding adhesive layer 5 is also singulated to obtain the bonding adhesive pieces 5p. As the dicing method, a method using a dicing blade or laser is exemplified. Incidentally, the thickness may be decreased by grinding the wafer W prior to the dicing of the wafer W.

After dicing, without irradiating the adhesive layer 3 with active energy rays, as illustrated in FIG. 8D, while the chips are separated from each other by expanding the base layer 1 at normal temperature or under cooling conditions, the bonding adhesive piece 5p is peeled off from the adhesive layer 3 by being thrust up by a pin 42, and the bonding adhesive piece-attached chip Tb is sucked by a suction collet 44 so as to be picked up.

Figure 9:
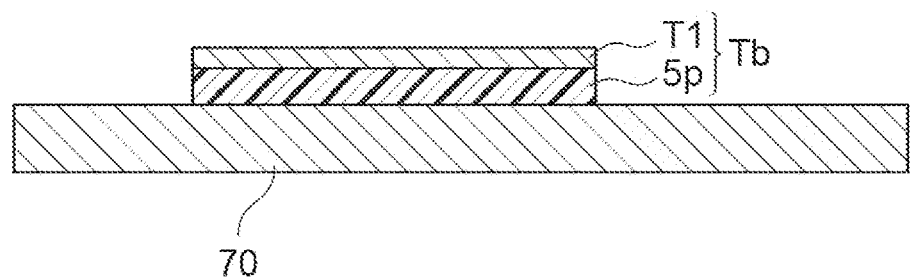
FIG. 9 is a cross-sectional view schematically illustrating a process of manufacturing the semiconductor device illustrated in FIG. 7.
Figure 10:
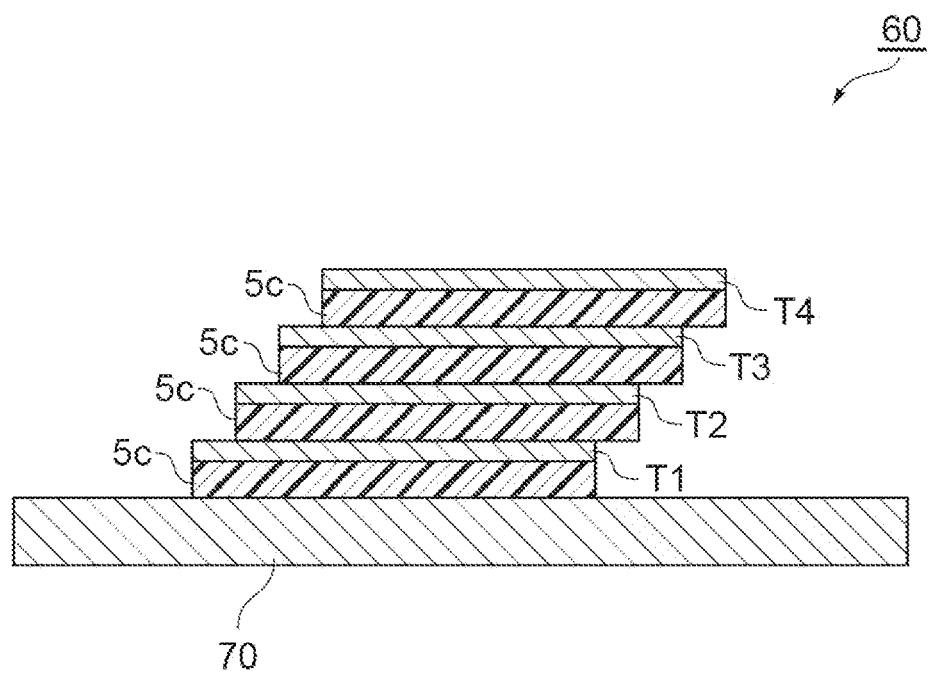
FIG. 10 is a cross-sectional view schematically illustrating a process of manufacturing the semiconductor device illustrated in FIG. 7.
Figure 11:
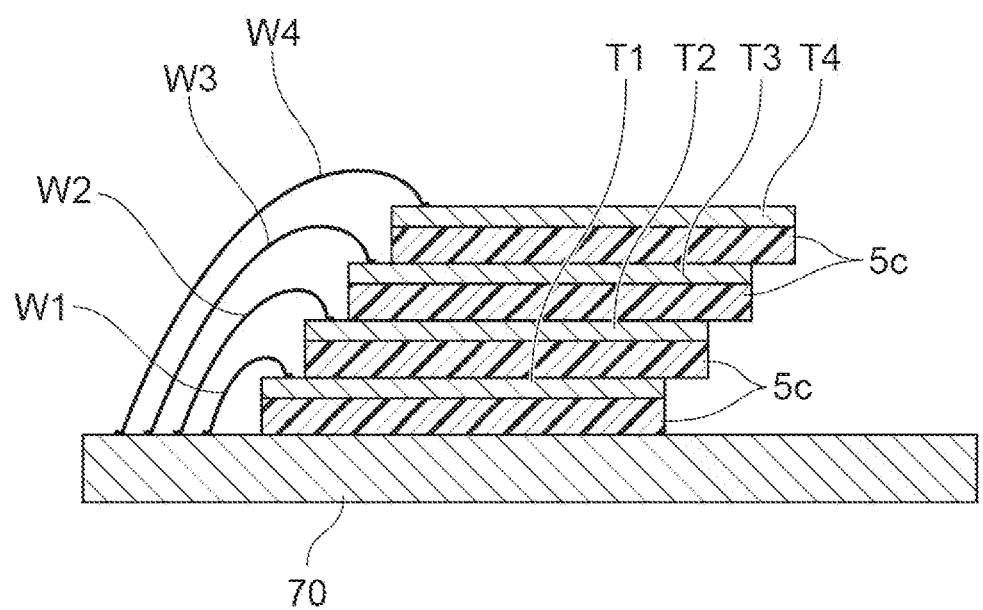
FIG. 11 is a cross-sectional view schematically illustrating a process of manufacturing the semiconductor device illustrated in FIG. 7.

The method for manufacturing the semiconductor device 100 will be specifically described with reference to FIG. 9 to FIG. 11. First, as illustrated in FIG. 9, the chip T1 at the first stage is pressure-bonded to a predetermined position of the substrate 70 through the bonding adhesive piece 5p. Next, the bonding adhesive piece 5p is cured by heating. Thereby, the bonding adhesive piece 5p is cured to obtain the cured product 5c. The curing treatment of the bonding adhesive piece 5p may be executed under a pressurized atmosphere from the viewpoint of reducing voids.

Similarly to the mounting of the chip T1 with respect to the substrate 70, the chip T2 at the second stage is mounted on the surface of the chip T1. Further, the chips T3 and T4 at the third and fourth stages are mounted, and thereby a structure 60 illustrated in FIG. 10 is produced. After the chips T1, T2, T3, and T4 and the substrate 70 are electrically connected by the wires W1, W2, W3, and W4 (see FIG. 11), the semiconductor element and the wires are covered by the sealing layer 50, and thereby the semiconductor device 100 illustrated in FIG. 7 is completed.

Hereinbefore, embodiments of the present disclosure have been described in detail, but the present invention is not limited to the above embodiments. For example, the film 10 may further include a cover film (not illustrated) covering the bonding adhesive layer 5. In the above-described embodiment, the embodiment in which the adhesive force of the first region 3a of the adhesive layer 3 is lowered as compared to the second region 3b by irradiation of active energy rays has been exemplified, but the adhesive layer 3 may be an ultraviolet curable type or a pressure-sensitive type.

In the above-described embodiment, the film 10 including the base layer 1, the adhesive layer 3, and the bonding adhesive layer 5 in order has been exemplified, but an embodiment not including the bonding adhesive layer 5 may be employed. In this case, for example, a bonding adhesive layer may be formed on a surface of a substrate on which a chip is mounted or a surface of another chip.

The evaluating method of the present disclosure is not limited to the case of using a dicing/die-bonding integrated film as an evaluation target, but may be used in the case of using pickup property of a chip (cutting piece) used in a manufacturing process of a semiconductor device as an evaluation target. This evaluating method includes the following processes:

(i) preparing a laminate including at least a base layer 1, an adhesive layer 3, and a wafer W in order;

(ii) singulating the wafer W into a plurality of chips having an area of 9 mm² or less; and (iii) pushing a center portion of the chip from a side of the base layer 1 and then measuring an edge peeling strength when an edge of the chip is peeled off from the adhesive layer 3.

The thickness of the wafer W is, for example, 10 to 100 μm and may be 30 to 80 μm. Incidentally, in the process (i), the above-described laminate may be prepared using the dicing/die-bonding integrated film. Furthermore, in the process (i), instead of the wafer W, a laminate including a metal layer or a resin layer may be prepared, and the pickup property of a cutting piece thereof may be evaluated.

The edge peeling strength may be used in the sorting of the dicing/die-bonding integrated film. That is, edge peeling strengths of two or more dicing/die-bonding integrated films are compared to determine relative merits of pickup property of the two or more dicing/die-bonding integrated films, and a dicing/die-bonding integrated film may be sorted. Thereby, a dicing/die-bonding integrated film with which a semiconductor device can be manufactured with a high yield can be efficiently sorted.

EXAMPLES

Hereinafter, the present disclosure will be described in more detail on the basis of Examples; however, the present invention is not limited to these Examples. Incidentally, unless otherwise specified, reagents were used as chemicals.

[Synthesis of Acrylic Resin (Production Example 1)]

The following components were put into a 2000-ml flask equipped with a three-one motor, a stirring blade, and a nitrogen gas introducing pipe.

Ethyl acetate (solvent): 635 g
2-Ethylhexyl acrylate: 395 g
2-Hydroxyethyl acrylate: 100 g
Methacrylic acid: 5 g
Azobisisobutyronitrile: 0.08 g After the contents were sufficiently stirred until being homogeneous, bubbling was executed for 60 minutes at a flow rate of 500 ml/min to remove dissolved oxygen in the system. The temperature was increased to 78° C. over 1 hour, and polymerization was performed for 6 hours after increasing temperature. Next, the reaction solution was transferred to a 2000-ml pressurizing oven equipped with a three-one motor, a stirring blade, and a nitrogen gas introducing pipe, heated at 120° C. and 0.28 MPa for 4.5 hours, and then cooled to room temperature (25° C., the same applies hereinafter).

Next, 490 g of ethyl acetate was added, and the mixture was stirred and diluted. After 0.10 g of dioctyltin dilaurate as a urethane-forming catalyst was added thereto, 48.6 g of 2-methacryloxyethyl isocyanate (Karenz MOI (trade name) manufactured by Showa Denko K.K.) was added, and the resultant product was reacted at 70° C. for 6 hours and then cooled to room temperature. Subsequently, ethyl acetate was added so that the content of non-volatile components in the acrylic resin solution became 35% by mass, and thereby a solution containing the (A) acrylic resin (Production Example 1) having a chain polymerizable functional group was obtained.

The solution containing the (A) acrylic resin obtained as described above was vacuum-dried at 60° C. over night. The solid content obtained according to this was subjected to elemental analysis with a full automatic elemental analysis apparatus (trade name: varioEL manufactured by Elementar), the content of the introduced 2-methacryloxyethyl isocyanate was calculated from the content of nitrogen, and as a result, the content thereof was 0.50 mmol/g.

Furthermore, the weight average molecular weight of the (A) acrylic resin in terms of polystyrene was obtained using the following apparatus. That is, GPC measurement was performed by using SD-8022/DP-8020/RI-8020 manufactured by Tosoh Corporation, using Gelpack GL-A150-S/GL-A160-S manufactured by Hitachi Chemical Company, Ltd. as a column, and using tetrahydrofuran as an eluent. As a result, the weight average molecular weight in terms of polystyrene was 800000. The hydroxyl value and the acid value measured according to the methods described in JIS K0070 were 56.1 mgKOH/g and 6.5 mgKOH/g, respectively. These results are collectively shown in Table 1.

[Synthesis of Acrylic Resin (Production Example 2)]

A solution of the (A) acrylic resin according to Production Example 2 produced by the same method as in Production Example 1 was obtained using the raw material monomer composition shown in Production Example 2 instead of the raw material monomer composition shown in Production Example 1 of Table 1. The measurement results of the (A) acrylic resin according to Production Example 2 are shown in Table 1.

Example 1

[Production of Dicing Film (Adhesive Layer)]

The following components were mixed and thereby a varnish for forming an adhesive layer was prepared (see Table 2). The amount of ethyl acetate (solvent) was adjusted so that the total amount of solid content of the varnish became 25% by mass.

(A) Acrylic resin solution (Production Example 1): 100 g (solid content)

(B) Photopolymerization initiator (2-hydroxy-1-{4-[4-(2-hydroxy-2-methyl-propionyl)-benzyl]-phenyl}-2-methyl-propan-1-one (IRGACURE 127 manufactured by Ciba Specialty Chemicals Co., Ltd., "IRGACURE" is the registered trademark): 1.0 g (C) Cross-linking agent (polyfunctional isocyanate, Coronate L manufactured by Nippon Polyurethane Industry Co., Ltd., solid content: 75%): 8.0 g (solid content)

Ethyl Acetate (Solvent)

A polyethylene terephthalate film (width: 450 mm, length: 500 mm, thickness: 38 μm) whose one surface was subjected to the mold release treatment was prepared. A varnish for forming an adhesive layer was applied to the surface subjected to the mold release treatment by using an applicator and then dried at 80° C. for 5 minutes. Thereby, a laminate (dicing film) including the polyethylene terephthalate film and the adhesive layer having a thickness of 30 μm which is formed thereon was obtained.

A polyolefin film (width: 450 mm, length: 500 mm, thickness: 80 μm) whose one surface was subjected to the corona treatment was prepared. The surface subjected to the corona treatment and the adhesive layer of the laminate was pasted at room temperature. Subsequently, the adhesive layer was transferred to the polyolefin film (cover film) by being pushed by a rubber roll. Thereafter, the resultant product was left to stand for 3 days at room temperature, and thereby a cover film-attached dicing film was obtained.

[Production of Die Bonding Film (Bonding Adhesive Layer A)]

First, cyclohexanone (solvent) was added to the following compositions, and the resultant product was stirred and mixed and then further kneaded for 90 minutes by using a bead mill.

Epoxy resin (YDCN-700-10 (trade name), manufactured by Nippon Steel & Sumikin Chemical Co., Ltd., cresol novolak type epoxy resin, epoxy equivalent: 210, molecular weight: 1200, softening point: 80° C.): 14 parts by mass Phenolic resin (MILEX XLC-LL (trade name), manufactured by Mitsui Chemicals, Inc., phenolic resin, hydroxyl equivalent: 175, water absorption percentage: 1.8%, heating mass decrease rate at 350° C.: 4%): 23 parts by mass Silane coupling agent (NUC A-189 (trade name) manufactured by NUC Corporation, γ-mercaptopropyl trimethoxysilane): 0.2 parts by mass Silane coupling agent (NUCA-1160 (trade name), manufactured by Nippon Unicar Company Limited, γ-ureidopropyl triethoxysilane): 0.1 parts by mass Filler ("SC2050-HLG (trade name), manufactured by Admatechs Company Limited, silica, average particle diameter: 0.500 μm): 32 parts by mass The following components were added to the composition obtained as described above, the resultant product was subjected to a stirring and mixing process and a vacuum deaeration, and thereby a varnish for forming a bonding adhesive layer was obtained.

Epoxy group-containing acrylic copolymer (HTR-860P-3 (trade name), manufactured by Nagase ChemteX Corporation, weight average molecular weight: 800000): 16 parts by mass Curing accelerator (CUREZOL 2PZ-CN (trade name), manufactured by SHIKOKU CHEMICALS CORPORATION, 1-cyanoethyl-2-phenylimidazole, "CUREZOL" is the registered trademark) 0.0.1 parts by mass A polyethylene terephthalate film (thickness: 35 μm) whose one surface was subjected to the mold release treatment was prepared. A varnish for forming a bonding adhesive layer was applied to the surface subjected to the mold release treatment by using an applicator and then dried by heating at 140° C. for 5 minutes. Thereby, a laminate (die bonding film) including the polyethylene terephthalate film (carrier film) and the bonding adhesive layer (B-stage state) having a thickness of 25 μm which is formed thereon was obtained.

[Production of Dicing/Die-Bonding Integrated Film]

The die bonding film including the bonding adhesive layer and the carrier film was cut into a circle having a diameter of 335 mm for each carrier film. The dicing film from which the polyethylene terephthalate film was peeled off was pasted thereto at room temperature and left to stand at room temperature for one day. Thereafter, the dicing film was cut into a circle having a diameter of 370 mm. The region (the first region of the adhesive layer) corresponding to a pasting position of the wafer in the bonding adhesive layer of the dicing/die-bonding integrated film obtained in this way was irradiated with ultraviolet rays as described below. That is, ultraviolet rays were partially applied at 70 W and an irradiance level of 300 mJ/cm² by using a pulsed xenon lamp. Incidentally, a part of an inner diameter of 318 mm from the center of the film was irradiated with ultraviolet rays by using a blackout curtain. In this way, a plurality of dicing/die-bonding integrated films for being provided to various evaluation tests described below were obtained.

Example 2

A plurality of dicing/die-bonding integrated films were obtained in the same manner as in Example 1, except that, when producing a dicing film, 1-hydroxy-cyclohexyl-phenyl-ketone, IRGACURE 184 manufactured by Ciba Specialty Chemicals Co., Ltd., ("IRGACURE" is the registered trademark) was used instead of "IRGACURE 127" and the irradiance level of ultraviolet rays was set to 200 mJ/cm² instead of 300 mJ/cm².

Example 3

A plurality of dicing/die-bonding integrated films were obtained in the same manner as in Example 2, except that the irradiance level of ultraviolet rays was set to 250 mJ/cm² instead of 200 mJ/cm².

Example 4

A plurality of dicing/die-bonding integrated films were obtained in the same manner as in Example 2, except that the irradiance level of ultraviolet rays was set to 300 mJ/cm² instead of 200 mJ/cm².

Example 5

A plurality of dicing/die-bonding integrated films were obtained in the same manner as in Example 4, except that a die bonding film having a bonding adhesive layer B formed as follows was used instead of the die bonding film having a bonding adhesive layer A as a die bonding film.
[Production of Die Bonding Film (Bonding Adhesive Layer B)]

First, cyclohexanone (solvent) was added to the following component, and the resultant product was stirred and mixed and then further kneaded for 90 minutes by using a bead mill.
  Filler ("SC2050-HLG (trade name), manufactured by
    Admatechs Company Limited, silica, average particle
    diameter: 0.500 µm): 50 parts by mass The following components were added to the composition obtained as described above, the resultant product was subjected to a stirring and mixing process and a vacuum deaeration, and thereby a varnish for forming a bonding adhesive layer was obtained.
  Epoxy group-containing acrylic copolymer (HTR-860P-3 (trade name), manufactured by Nagase ChemteX Corporation, weight average molecular weight: 800000): 100 parts by mass
  Curing accelerator (CUREZOL 2PZ-CN (trade name), manufactured by SHIKOKU CHEMICALS CORPORATION, 1-cyanoethyl-2-phenylimidazole, "CUREZOL" is the registered trademark) 0.1 parts by mass Comparative Example 1

A plurality of dicing/die-bonding integrated films were obtained in the same manner as in Example 1, except that, when producing a dicing film, the solution of the (A) acrylic resin according to Production Example 2 was used, and the amount of the cross-linking agent was set to 6.0 parts by mass instead of 8.0 parts by mass.

Comparative Example 2

A plurality of dicing/die-bonding integrated films were obtained in the same manner as in Example 1, except that, when producing a dicing film, the amount of the cross-linking agent was set to 6.0 parts by mass instead of 8.0 parts by mass.

Comparative Example 3

A plurality of dicing/die-bonding integrated films were obtained in the same manner as in Example 1, except that the irradiance level of ultraviolet rays was set to 500 mJ/cm² instead of 300 mJ/cm².

[Evaluation test]
(1) Measurement of Adhesive Force (30° Peeling Strength) of Adhesive Layer with Respect to Bonding Adhesive Layer The adhesive force of the adhesive layer (ultraviolet ray-irradiated region) with respect to the bonding adhesive layer was evaluated by measuring 30° peeling strength. That is, a measurement sample having a width of 25 mm and a length of 100 mm was cut from the dicing/die-bonding integrated film. The laminate of the adhesive layer (ultraviolet ray-irradiated region) and the bonding adhesive layer was used as the measurement sample. The peeling strength of the adhesive layer (ultraviolet ray-irradiated region) with respect to the bonding adhesive layer was measured by using a tension tester. The measurement conditions were set to a peeling angle of 30° and a tension rate of 60 mm/min. Incidentally, the storage of the sample and the measurement of the peeling strength were performed in an environment of a temperature of 23° C. and a relative humidity of 40%.
(2) Measurement of Edge Peeling Strength of Chip The dicing/die-bonding integrated film was pasted to a silicon wafer (diameter: 12 inches, thickness: 50 µm) and a dicing ring under the following conditions. The elongation of the dicing/die-bonding integrated film after the silicon wafer and the dicing ring were pasted in the MD direction was about 1.0 to 1.3%.
<Pasting Conditions>
  Pasting apparatus: DFM2800 (manufactured by DISCO Corporation)
  Pasting temperature: 70° C.
  Pasting rate: 10 mm/s
  Pasting tension level: Level 6

Next, the dicing/die-bonding integrated film-attached silicon wafer was singulated by blade dicing into a plurality of bonding adhesive piece-attached chips (size: 2 mm×2 mm)
<Dicing Conditions>
  Dicer: DFD6361 (manufactured by DISCO Corporation)
  Blade: ZH05-5D4000-N1-70-BB (manufactured by DISCO Corporation)
  Blade rotation number: 40000 rpm
  Dicing rate: 30 mm/sec
  Blade height: 90 µm
  Cutting depth from the surface of the adhesive layer: 20 µm Water amount at the time of dicing Blade cooler: 1.5 L/min Shower: 1.0 L/min Spray: 1.0 L/min In one day after dicing, under the following measurement conditions, the bonding adhesive piece-attached chip was pushed from the side of the base layer, and the edge peeling strength of the bonding adhesive piece-attached chip was measured (see FIG. 2C). Incidentally, before measurement, the surface of the base layer corresponding to the center portion of the chip was marked with an oil-based ballpoint pen. The center portion of the chip was specified by being measured with a ruler. The measurement was performed at N=10. After performing measurement for one chip, the next measurement with an interval of three chips was performed (see FIG. 4).

TABLE 1

| Acrylic resin | | Production Ex. 1 | Production Ex. 2 |
|---|---|---|---|
| Raw material monomer (parts by mass) | 2-Ethylhexyl acrylate | 79 | 79 |
| | 2-Hydroxyethyl acrylate | 20 | 20 |
| | Methacrylic acid | 1 | 1 |
| | (Total) | (100) | (100) |
| | 2-Methacryloxyethyl isocyanate | 9.7 | 16.2 |
| Weight average molecular weight | | $80 \times 10^4$ | $80 \times 10^4$ |
| Hydroxyl value (mgKOH/g) | | 56.1 | 32.8 |
| Acid value (mgKOH/g) | | 6.5 | 6.5 |
| Amount (mmol/g) of chain polymerizable functional group | | 0.5 | 0.9 |

TABLE 2

| | | | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|---|---|
| Composition of adhesive layer (parts by mass) | Acrylic resin | Production Ex. 1 | 100 | 100 | 100 | 100 | 100 | — | 100 | 100 |
| | | Production Ex. 2 | — | — | — | — | — | 100 | — | — |
| | Photo-Polymerization initiator | IRGACURE 127 | 1.0 | — | — | — | — | 1.0 | 1.0 | 1.0 |
| | | IRGACURE 184 | — | 1.0 | 1.0 | 1.0 | 1.0 | — | — | — |
| | Cross-linking agent | | 8.0 | 8.0 | 8.0 | 8.0 | 8.0 | 6.0 | 6.0 | 8.0 |
| | Bonding adhesive layer | | A | A | A | A | B | A | A | A |
| | Irradiance level (mJ/cm²) of ultraviolet rays | | 300 | 200 | 250 | 300 | 300 | 300 | 300 | 500 |
| | 30° Peeling strength (N/25 mm) of adhesive layer (UV-irradiated region) with respect to bonding adhesive layer | | 2.3 | 2.6 | 2.2 | 1.8 | 1.7 | 0.95 | 2.6 | 1.5 |
| | Edge peeling strength (N) of bonding adhesive piece-attached chip | | 1.1 | 0.90 | 0.90 | 0.92 | 0.92 | 1.6 | 1.3 | 1.3 |
| | Pickup property | | A | A | A | A | A | C | B | B |

<Measurement Conditions>

Measurement device: compact tabletop tester EZ-SX (manufactured by SHIMADZU CORPORATION)

Load cell: 50 N

Push jig: ZTS series accessory attachment (shape: conical shape, manufactured by IMADA CO., LTD.)

Pushing rate: 60 mm/min

Temperature: 23° C.

Humidity: 45±10%

(3) Evaluation of Pickup Property

After the measurement of the edge peeling strength described above, 100 bonding adhesive piece-attached chips were picked up under the following conditions.

<Pickup Conditions>

Die bonding apparatus: DB800-HSD (manufactured by Hitachi High-Tech Corporation)

Thrust-up pin: EJECTOR NEEDLE SEN2-83-05 (diameter: 0.7 mm, tip end shape: hemisphere having a radius of 350 μm, manufactured by Micromechanics, Inc.)

Thrust-up height: 200 μm

Thrust-up rate: 1 mm/sec

Incidentally, one thrust-up pin was disposed at the center portion of the chip. A case where the pickup success rate was 100% was designated as "A", a case where the pickup success rate was 70% or more and less than 100% was designated as "B", and a case where the pickup success rate was less than 70% was designated as "C". The results are shown in Table 1.

As shown in Table 2, the pickup property was more favorable in Examples 1 to 5 than in Comparative Examples 1 to 3. Specifically, although the 30° peeling strength in Comparative Example 1 was a considerably lower value than those of Examples 1 to 4, since the edge peeling strength of the chip was 1.6 N that was high, the pickup property of Comparative Example 1 was significantly degraded. Furthermore, although the 30° peeling strength in Comparative Example 2 was equal to that of Example 2, since the edge peeling strength of the chip was 1.3 N that was relatively high, the pickup property of Comparative Example 2 was considered to be degraded. Furthermore, the 30° peeling strength in Comparative Example 3 was a low value by increasing the irradiance level of ultraviolet rays from that of Example 1; on the other hand, since the edge peeling strength of the chip was 1.3 N that was relatively high, the pickup property of Comparative Example 3 was considered to be degraded. From this point, it was found that not only the composition of the adhesive layer but also the irradiance level of ultraviolet rays is an important factor in the edge peeling strength of the chip and the pickup property.

From the above results, it became clear that the pickup property of a small chip has a correlation with the edge peeling strength of the chip, and it was found that, when the edge peeling strength is 1.2 N or less, favorable pickup property is obtainable.

INDUSTRIAL APPLICABILITY

According to the present disclosure, there are provided methods for evaluating and sorting a dicing/die-bonding integrated film in consideration of an influence of edge peeling of a small chip (having an area of 9 mm² or less). Furthermore, according to the present disclosure, there is provided a method for evaluating pickup property in consideration of an influence of edge peeling of a small chip, a dicing/die-bonding integrated film having excellent pickup property of a small chip, and a method for manufacturing a semiconductor device by using the film.

REFERENCE SIGNS LIST

1: base layer, 3: adhesive layer, 3a: first region, 3b: second region, 5: bonding adhesive layer, 5p: bonding adhesive piece, 5c: cured product, 10: dicing/die-bonding integrated film, 42: pin, 44: suction collet, 50: sealing layer, 60: structure, 70: substrate, 80: support plate, 100: semiconductor device, A: measurement area, DR: dicing ring, F1: first surface, F2: second surface, M: mark, N: notch, P: push jig, Rw: region, T1, T2, T3, T4, Ts: chip, Ta, Tb: bonding adhesive piece-attached chip, W: wafer, Ws: silicon wafer, W1, W2, W3, W4: wire.

The invention claimed is:

1. A method for evaluating a dicing/die-bonding integrated film, the method comprising:
    preparing a dicing/die-bonding integrated film serving as an evaluation target, the dicing/die-bonding integrated film including a base layer, an adhesive layer having a first surface facing the base layer and a second surface opposite to the first surface, and a bonding adhesive layer provided to cover a center portion of the second surface of the adhesive layer;
    pasting a silicon wafer having a thickness of 50 µm to the bonding adhesive layer and pasting a dicing ring to the second surface of the adhesive layer;
    singulating the silicon wafer and the bonding adhesive layer into a plurality of bonding adhesive piece-attached chips including a bonding adhesive piece-attached chip having a square shape having a side length of 2 mm;
    pushing a center portion of the bonding adhesive piece-attached chip from a side of the base layer at a temperature of 23° C. at a rate of 60 mm/min;
    measuring an edge peeling strength when an edge of the bonding adhesive piece-attached chip is peeled off from the adhesive layer, while the center portion of the bonding adhesive piece-attached chip is pushed; and
    determining that the dicing/die-bonding integrated film has favorable pickup property when the edge peeling strength is 1.2 N or less.

2. A manufacturing process film that is selected based on the method for evaluating according to claim 1, such that the manufacturing process film has an identical layered structure as the dicing/die-bonding integrated film including the edge peeling strength of 1.2 N or less.

3. The manufacturing process film according to claim 2, wherein the manufacturing process film is applied to a semiconductor device manufacturing process including a process of singulating a wafer and a bonding adhesive layer of the manufacturing process film, into a plurality of bonding adhesive piece-attached chips having an area of 9 mm² or less.

4. The manufacturing process film according to claim 3, wherein in the singulating process, the plurality of bonding adhesive piece-attached chips are obtained from the manufacturing process film, by blade dicing.

5. The method according to claim 1, wherein the plurality of bonding adhesive piece-attached chips are singulated by dicing entirely through each of the silicon wafer, the bonding adhesive layer and the adhesive layer of the dicing/die-bonding integrated film.

6. A method for sorting a dicing/die-bonding integrated film, the method comprising:
    measuring a first edge peeling strength associated with a first dicing/die-bonding integrated film including a base layer, a bonding adhesive layer, and an adhesive layer located between the base layer and the bonding adhesive layer, by:
        selecting a first bonding adhesive piece-attached chip singulated from the first dicing/die-bonding integrated film, wherein the first bonding adhesive piece-attached chip includes a chip layer pasted onto the bonding adhesive layer of the first dicing/die-bonding integrated film; and
        pushing a center portion of the first bonding adhesive piece-attached chip, wherein the first edge peeling strength is measured when an edge of the first bonding adhesive piece-attached chip is peeled off from the adhesive layer, while the center portion of the first bonding adhesive piece-attached chip is pushed;
    measuring a second edge peeling strength associated with a second dicing/die-bonding integrated film; and
    determining relative pickup properties of the first dicing/die-bonding integrated film and the second dicing/die-bonding integrated film by comparing the first edge peeling strength with the second edge peeling strength.

7. The method according to claim 6, wherein the center portion of the first bonding adhesive piece-attached chip is pushed from a side of the base layer of the first dicing/die-bonding integrated film, at a temperature of 23° C. and at a rate of 60 mm/min.

8. The method according to claim 6, wherein the chip layer has a thickness of approximately 50 µm.

9. The method according to claim 6, wherein the first bonding adhesive piece-attached chip has a square shape having a side length of approximately 2 mm.

10. The method according to claim 6, wherein the first bonding adhesive piece-attached chip is selected by:
    pasting a silicon wafer to the bonding adhesive layer of the first dicing/die-bonding integrated film to form the chip layer of the first bonding adhesive piece-attached chip; and
    singulating the silicon wafer and the bonding adhesive layer into a plurality of first bonding adhesive piece-attached chips, wherein the first bonding adhesive piece-attached chip is selected from among the plurality of first bonding adhesive piece-attached chips.

11. The method according to claim 10,
    wherein the adhesive layer of the first dicing/die-bonding integrated film has a first surface facing the base layer and a second surface opposite to the first surface that faces the bonding adhesive layer,
    wherein the bonding adhesive layer covers a center portion of the second surface of the adhesive layer in the first dicing/die-bonding integrated film, and
    wherein a dicing ring is pasted to the second surface of the adhesive layer when the plurality of second bonding adhesive piece-attached chips are singulated.

12. The method according to claim 6, wherein the second edge peeling strength is measured by:

selecting a second bonding adhesive piece-attached chip singulated from the second dicing/die-bonding integrated film that includes a base layer, a bonding adhesive layer, and an adhesive layer located between the base layer and the bonding adhesive layer, wherein the second bonding adhesive piece-attached chip includes a chip layer pasted onto the bonding adhesive layer of the second dicing/die-bonding integrated film; and pushing a center portion of the second bonding adhesive piece-attached chip, wherein the second edge peeling strength is measured when an edge of the second bonding adhesive piece-attached chip is peeled off from the adhesive layer, while the center portion of the second bonding adhesive piece-attached chip is pushed.

13. The method according to claim 12, wherein the center portion of the second bonding adhesive piece-attached chip is pushed from a side of the base layer of the second dicing/die-bonding integrated film, at a temperature of 23° C. and at a rate of 60 mm/min.

14. The method according to claim 12, wherein the chip layer of the second bonding adhesive piece-attached chip has a thickness of approximately 50 μm.

15. The method according to claim 12, wherein the second bonding adhesive piece-attached chip has a square shape having a side length of approximately 2 mm.

16. The method according to claim 12, wherein the second bonding adhesive piece-attached chip is selected by:
pasting a silicon wafer to the bonding adhesive layer of the second dicing/die-bonding integrated film to form the chip layer of the second bonding adhesive piece-attached chip; and
singulating the silicon wafer and the bonding adhesive layer into a plurality of second bonding adhesive piece-attached chips, wherein the second bonding adhesive piece-attached chip is selected from among the plurality of second bonding adhesive piece-attached chips.

17. The method according to claim 16,
wherein the adhesive layer of the second dicing/die-bonding integrated film has a first surface facing the base layer and a second surface opposite to the first surface that faces the bonding adhesive layer,
wherein the bonding adhesive layer covers a center portion of the second surface of the adhesive layer in the second dicing/die-bonding integrated film, and
wherein a dicing ring is pasted to the second surface of the adhesive layer when the plurality of second bonding adhesive piece-attached chips are singulated.

18. The method according to claim 6, further comprising:
measuring one or more additional edge peeling strengths associated with respective one or more additional dicing/die-bonding integrated films; and
determining relative pickup properties of the first dicing/die-bonding integrated film, of the second dicing/die-bonding integrated film, and of the one or more additional dicing/die-bonding integrated films, by further comparing the one or more additional edge peeling strengths together with the first edge peeling strength and the second edge peeling strength.

19. The method according to claim 6,
wherein the first dicing/die-bonding integrated film is a separate film from the second dicing/die-bonding integrated film, and
wherein the first edge peeling strength measured at an edge of the first bonding adhesive piece-attached chip is different from the second edge peeling strength measured at an edge of the second bonding adhesive piece-attached chip.

* * * * *